US010382168B2

(12) United States Patent
Miyata et al.

(10) Patent No.: US 10,382,168 B2
(45) Date of Patent: Aug. 13, 2019

(54) ENCODER DEVICE, DECODER DEVICE AND TRANSMISSION APPARATUS

(71) Applicant: Mitsubishi Electric Corporation, Tokyo (JP)

(72) Inventors: Yoshikuni Miyata, Tokyo (JP); Kenya Sugihara, Tokyo (JP); Hideo Yoshida, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 120 days.

(21) Appl. No.: 15/570,666

(22) PCT Filed: Sep. 7, 2015

(86) PCT No.: PCT/JP2015/075346
§ 371 (c)(1),
(2) Date: Oct. 30, 2017

(87) PCT Pub. No.: WO2017/042864
PCT Pub. Date: Mar. 16, 2017

(65) Prior Publication Data
US 2018/0294921 A1    Oct. 11, 2018

(51) Int. Cl.
*H03M 13/00* (2006.01)
*H04L 1/00* (2006.01)
(Continued)

(52) U.S. Cl.
CPC ...... *H04L 1/0071* (2013.01); *H03M 13/2703* (2013.01); *H03M 13/2792* (2013.01);
(Continued)

(58) Field of Classification Search
CPC ......... H03M 13/2703; H03M 13/2792; H03M 13/2796; H03M 13/6508; H03M 13/6561;
(Continued)

(56) References Cited

U.S. PATENT DOCUMENTS 6,397,368 B1 * 5/2002 Yonge, III ............ H04L 1/0003
714/784
7,826,556 B2 * 11/2010 Ghosh ................. H04L 27/2602
375/299
(Continued)

FOREIGN PATENT DOCUMENTS

EP        2 001 151 A2    12/2008
JP       2008-516533 A     5/2008
(Continued)

OTHER PUBLICATIONS

International Search Report for PCT/JP2015/075346 (PCT/ISA/210) dated Oct. 6, 2015.
(Continued)

*Primary Examiner* — Albert Decady
*Assistant Examiner* — Enamul M Kabir
(74) *Attorney, Agent, or Firm* — Birch, Stewart, Kolasch & Birch, LLP

(57) ABSTRACT

An error correction encoder (10) includes an interleaver circuit (31), encoding circuits ($32_1$, $32_2$) and a deinterleaver circuit (33). The interleaver circuit (31) generates, in a standard speed mode, a single series of yet-to-be-coded bit sequences ($IL_1$) on the basis of the bits in plural columns that are arranged at an interval of C columns in a single series of transmission frames, and generates, in a two-times speed mode, two series of yet-to-be-coded bit sequences ($IL_1$, $IL_2$) on the basis of the bits in plural columns that are arranged at an interval of C/2 columns in each of two series of transmission frames. The encoding circuits ($32_1$, $32_2$) apply error-correction coding to either the single series of yet-to-be-coded bit sequences ($IL_1$) or the two series of yet-to-be-coded bit sequences ($IL_1$, $IL_2$).

18 Claims, 23 Drawing Sheets

(51) Int. Cl.
*H03M 13/27* (2006.01)
*H04J 3/16* (2006.01)

(52) U.S. Cl.
CPC ... *H03M 13/2796* (2013.01); *H03M 13/6508* (2013.01); *H03M 13/6561* (2013.01); *H03M 13/6563* (2013.01); *H04L 1/0041* (2013.01); *H04J 3/1652* (2013.01); *H04J 2203/0089* (2013.01)

(58) Field of Classification Search
CPC ....... H03M 13/6563; H04B 1/00; H04B 7/00; H04B 7/04; H04J 3/1652; H04J 2203/0089; H04L 1/0041; H04L 1/0071; H04L 1/00; H04L 27/26; H04L 72/04
See application file for complete search history.

(56) References Cited

U.S. PATENT DOCUMENTS

| | | | | |
|---|---|---|---|---|
| 2001/0009569 A1* | 7/2001 | Kang | ............. | H03M 13/27 375/242 |
| 2002/0150167 A1* | 10/2002 | Demjanenko | ....... | H04L 27/3416 375/259 |
| 2004/0025106 A1* | 2/2004 | Massey | ............. | H03M 13/2957 714/786 |
| 2006/0088054 A1 | 4/2006 | Tzannes et al. | | |
| 2006/0274852 A1* | 12/2006 | Trachewsky | ......... | H04L 1/0002 375/295 |
| 2007/0147521 A1* | 6/2007 | Horng | ................. | H04B 7/0669 375/260 |
| 2007/0162819 A1* | 7/2007 | Kawamoto | .......... | H04B 7/0854 714/758 |
| 2010/0146363 A1* | 6/2010 | Birru | .................... | H04L 1/0043 714/752 |
| 2011/0004806 A1 | 1/2011 | Adachi | | |
| 2011/0110449 A1* | 5/2011 | Ramprashad | ......... | H04L 1/0003 375/261 |
| 2011/0173511 A1* | 7/2011 | Miyata | ................ | H03M 13/271 714/755 |
| 2013/0311847 A1 | 11/2013 | Miyata et al. | | |
| 2014/0016571 A1* | 1/2014 | Yucek | ................... | H04L 1/0071 370/329 |
| 2016/0269810 A1* | 9/2016 | Chow | ................ | H04B 10/2504 |

FOREIGN PATENT DOCUMENTS

| | | |
|---|---|---|
| JP | 2008-199142 A | 8/2008 |
| JP | 2011-146932 A | 7/2011 |
| JP | 5299130 B2 | 9/2013 |
| JP | 5523120 B2 | 6/2014 |
| JP | 5619280 B2 | 11/2014 |

OTHER PUBLICATIONS

ITU-T G-Series Recommendations, "Interfaces for the Optical Transport Network (OTN)", International Telecommunication Union, Reccomendation ITU-T G.709/Y.1331, 2009, 218 pages.
Written Opinion of the International Searching Authority for PCT/JP2015/075346 (PCT/ISA/237) dated Oct. 6, 2015.

* cited by examiner

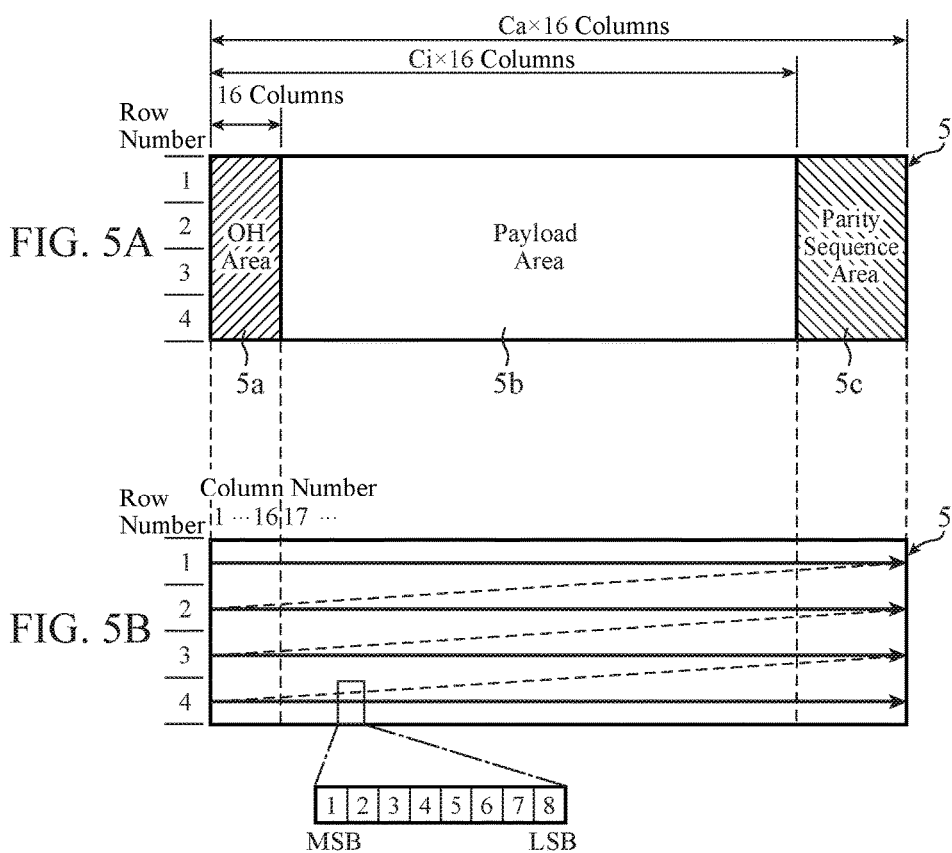

FIG. 8

| Row Number | Column Number 0 | 1 | 2 | 3 | 4 | 5 | 6 | 7 | .... |
|---|---|---|---|---|---|---|---|---|---|
| 127 | #A0-b0 | #A8-b0 | #A16-b0 | #A24-b0 | #A0-b16 | #A8-b16 | #A16-b16 | #A24-b16 | |
| 126 | #A1-b0 | #A9-b0 | #A17-b0 | #A25-b0 | #A1-b16 | #A9-b16 | #A17-b16 | #A25-b16 | |
| ⋮ | ⋮ | ⋮ | ⋮ | ⋮ | ⋮ | ⋮ | ⋮ | ⋮ | |
| 120 | #A7-b0 | #A15-b0 | #A23-b0 | #A31-b0 | #A7-b16 | #A15-b16 | #A23-b16 | #A31-b16 | |
| 119 | #A0-b1 | #A8-b1 | #A16-b1 | #A24-b1 | #A0-b17 | #A8-b17 | #A16-b17 | #A24-b17 | |
| ⋮ | ⋮ | ⋮ | ⋮ | ⋮ | ⋮ | ⋮ | ⋮ | ⋮ | |
| 112 | #A7-b1 | #A15-b1 | #A23-b1 | #A31-b1 | #A7-b17 | #A15-b17 | #A23-b17 | #A31-b17 | |
| 111 | #A0-b2 | #A8-b2 | #A16-b2 | #A24-b2 | #A0-b18 | #A8-b18 | #A16-b18 | #A24-b18 | |
| ⋮ | ⋮ | ⋮ | ⋮ | ⋮ | ⋮ | ⋮ | ⋮ | ⋮ | |
| 104 | #A7-b2 | #A15-b2 | #A23-b2 | #A31-b2 | #A7-b18 | #A15-b18 | #A23-b18 | #A31-b18 | |
| 103 | #A0-b3 | #A8-b3 | #A16-b3 | #A24-b3 | #A0-b19 | #A8-b19 | #A16-b19 | #A24-b19 | |
| ⋮ | ⋮ | ⋮ | ⋮ | ⋮ | ⋮ | ⋮ | ⋮ | ⋮ | |
| 96 | #A7-b3 | #A15-b3 | #A23-b3 | #A31-b3 | #A7-b19 | #A15-b19 | #A23-b19 | #A31-b19 | |
| 95 | #A0-b4 | #A8-b4 | #A16-b4 | #A24-b4 | #A0-b20 | #A8-b20 | #A16-b20 | #A24-b20 | |
| ⋮ | ⋮ | ⋮ | ⋮ | ⋮ | ⋮ | ⋮ | ⋮ | ⋮ | |
| 88 | #A7-b4 | #A15-b4 | #A23-b4 | #A31-b4 | #A7-b20 | #A15-b20 | #A23-b20 | #A31-b20 | |
| 87 | #A0-b5 | #A8-b5 | #A16-b5 | #A24-b5 | #A0-b21 | #A8-b21 | #A16-b21 | #A24-b21 | |
| ⋮ | ⋮ | ⋮ | ⋮ | ⋮ | ⋮ | ⋮ | ⋮ | ⋮ | |
| 80 | #A7-b5 | #A15-b5 | #A23-b5 | #A31-b5 | #A7-b21 | #A15-b21 | #A23-b21 | #A31-b21 | |
| 79 | #A0-b6 | #A8-b6 | #A16-b6 | #A24-b6 | #A0-b22 | #A8-b22 | #A16-b22 | #A24-b22 | |
| ⋮ | ⋮ | ⋮ | ⋮ | ⋮ | ⋮ | ⋮ | ⋮ | ⋮ | |
| 72 | #A7-b6 | #A15-b6 | #A23-b6 | #A31-b6 | #A7-b22 | #A15-b22 | #A23-b22 | #A31-b22 | |
| 71 | #A0-b7 | #A8-b7 | #A16-b7 | #A24-b7 | #A0-b23 | #A8-b23 | #A16-b23 | #A24-b23 | |
| ⋮ | ⋮ | ⋮ | ⋮ | ⋮ | ⋮ | ⋮ | ⋮ | ⋮ | |
| 64 | #A7-b7 | #A15-b7 | #A23-b7 | #A31-b7 | #A7-b23 | #A15-b23 | #A23-b23 | #A31-b23 | |
| 63 | #A0-b8 | #A8-b8 | #A16-b8 | #A24-b8 | #A0-b24 | #A8-b24 | #A16-b24 | #A24-b24 | |
| ⋮ | ⋮ | ⋮ | ⋮ | ⋮ | ⋮ | ⋮ | ⋮ | ⋮ | |
| 56 | #A7-b8 | #A15-b8 | #A23-b8 | #A31-b8 | #A7-b24 | #A15-b24 | #A23-b24 | #A31-b24 | |
| 55 | #A0-b9 | #A8-b9 | #A16-b9 | #A24-b9 | #A0-b25 | #A8-b25 | #A16-b25 | #A24-b25 | |
| ⋮ | ⋮ | ⋮ | ⋮ | ⋮ | ⋮ | ⋮ | ⋮ | ⋮ | |
| 48 | #A7-b9 | #A15-b9 | #A23-b9 | #A31-b9 | #A7-b25 | #A15-b25 | #A23-b25 | #A31-b25 | |
| 47 | #A0-b10 | #A8-b10 | #A16-b10 | #A24-b10 | #A0-b26 | #A8-b26 | #A16-b26 | #A24-b26 | |
| ⋮ | ⋮ | ⋮ | ⋮ | ⋮ | ⋮ | ⋮ | ⋮ | ⋮ | |
| 40 | #A7-b10 | #A15-b10 | #A23-b10 | #A31-b10 | #A7-b26 | #A15-b26 | #A23-b26 | #A31-b26 | |
| 39 | #A0-b11 | #A8-b11 | #A16-b11 | #A24-b11 | #A0-b27 | #A8-b27 | #A16-b27 | #A24-b27 | |
| ⋮ | ⋮ | ⋮ | ⋮ | ⋮ | ⋮ | ⋮ | ⋮ | ⋮ | |
| 32 | #A7-b11 | #A15-b11 | #A23-b11 | #A31-b11 | #A7-b27 | #A15-b27 | #A23-b27 | #A31-b27 | |
| 31 | #A0-b12 | #A8-b12 | #A16-b12 | #A24-b12 | #A0-b28 | #A8-b28 | #A16-b28 | #A24-b28 | |
| ⋮ | ⋮ | ⋮ | ⋮ | ⋮ | ⋮ | ⋮ | ⋮ | ⋮ | |
| 24 | #A7-b12 | #A15-b12 | #A23-b12 | #A31-b12 | #A7-b28 | #A15-b28 | #A23-b28 | #A31-b28 | |
| 23 | #A0-b13 | #A8-b13 | #A16-b13 | #A24-b13 | #A0-b29 | #A8-b29 | #A16-b29 | #A24-b29 | |
| ⋮ | ⋮ | ⋮ | ⋮ | ⋮ | ⋮ | ⋮ | ⋮ | ⋮ | |
| 16 | #A7-b13 | #A15-b13 | #A23-b13 | #A31-b13 | #A7-b29 | #A15-b29 | #A23-b29 | #A31-b29 | |
| 15 | #A0-b14 | #A8-b14 | #A16-b14 | #A24-b14 | #A0-b30 | #A8-b30 | #A16-b30 | #A24-b30 | |
| ⋮ | ⋮ | ⋮ | ⋮ | ⋮ | ⋮ | ⋮ | ⋮ | ⋮ | |
| 8 | #A7-b14 | #A15-b14 | #A23-b14 | #A31-b14 | #A7-b30 | #A15-b30 | #A23-b30 | #A31-b30 | |
| 7 | #A0-b15 | #A8-b15 | #A16-b15 | #A24-b15 | #A0-b31 | #A8-b31 | #A16-b31 | #A24-b31 | |
| ⋮ | ⋮ | ⋮ | ⋮ | ⋮ | ⋮ | ⋮ | ⋮ | ⋮ | |
| 1 | #A6-b15 | #A14-b15 | #A22-b15 | #A30-b15 | #A6-b31 | #A14-b31 | #A22-b31 | #A30-b31 | |
| 0 | #A7-b15 | #A15-b15 | #A23-b15 | #A31-b15 | #A7-b31 | #A15-b31 | #A23-b31 | #A31-b31 | |

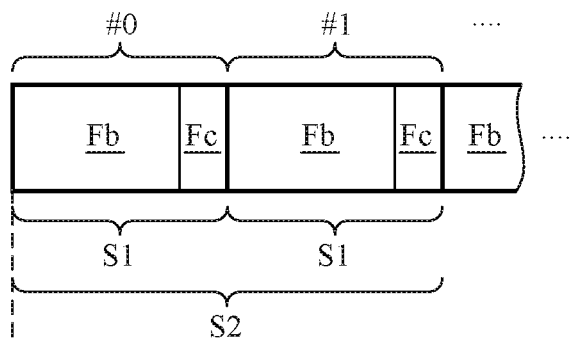
FIG. 9A Series A
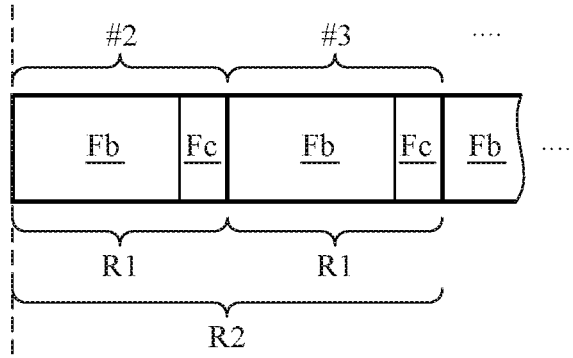
FIG. 9B Series B

FIG. 10

| Row Number | Column Number 0 | 1 | 2 | 3 | 4 | 5 | 6 | 7 | .... |
|---|---|---|---|---|---|---|---|---|---|
| 127 | #A0-b0 | #A8-b0 | #A0-b16 | #A8-b16 | #A0-b32 | #A8-b32 | #A0-b48 | #A8-b48 | |
| 126 | #A1-b0 | #A9-b0 | #A1-b16 | #A9-b16 | #A1-b32 | #A9-b32 | #A1-b48 | #A9-b48 | |
| ⋮ | ⋮ | ⋮ | ⋮ | ⋮ | ⋮ | ⋮ | ⋮ | ⋮ | |
| 120 | #A7-b0 | #A15-b0 | #A7-b16 | #A15-b16 | #A7-b32 | #A15-b32 | #A7-b48 | #A15-b48 | |
| 119 | #A0-b1 | #A8-b1 | #A0-b17 | #A8-b17 | #A0-b33 | #A8-b33 | #A0-b49 | #A8-b49 | |
| ⋮ | ⋮ | ⋮ | ⋮ | ⋮ | ⋮ | ⋮ | ⋮ | ⋮ | |
| 112 | #A7-b1 | #A15-b1 | #A7-b17 | #A15-b17 | #A7-b33 | #A15-b33 | #A7-b49 | #A15-b49 | |
| 111 | #A0-b2 | #A8-b2 | #A0-b18 | #A8-b18 | #A0-b34 | #A8-b34 | #A0-b50 | #A8-b50 | |
| ⋮ | ⋮ | ⋮ | ⋮ | ⋮ | ⋮ | ⋮ | ⋮ | ⋮ | |
| 104 | #A7-b2 | #A15-b2 | #A7-b18 | #A15-b18 | #A7-b34 | #A15-b34 | #A7-b50 | #A15-b50 | |
| 103 | #A0-b3 | #A8-b3 | #A0-b19 | #A8-b19 | #A0-b35 | #A8-b35 | #A0-b51 | #A8-b51 | |
| ⋮ | ⋮ | ⋮ | ⋮ | ⋮ | ⋮ | ⋮ | ⋮ | ⋮ | |
| 96 | #A7-b3 | #A15-b3 | #A7-b19 | #A15-b19 | #A7-b35 | #A15-b35 | #A7-b51 | #A15-b51 | |
| 95 | #A0-b4 | #A8-b4 | #A0-b20 | #A8-b20 | #A0-b36 | #A8-b36 | #A0-b52 | #A8-b52 | |
| ⋮ | ⋮ | ⋮ | ⋮ | ⋮ | ⋮ | ⋮ | ⋮ | ⋮ | |
| 88 | #A7-b4 | #A15-b4 | #A7-b20 | #A15-b20 | #A7-b36 | #A15-b36 | #A7-b52 | #A15-b52 | |
| 87 | #A0-b5 | #A8-b5 | #A0-b21 | #A8-b21 | #A0-b37 | #A8-b37 | #A0-b53 | #A8-b53 | |
| ⋮ | ⋮ | ⋮ | ⋮ | ⋮ | ⋮ | ⋮ | ⋮ | ⋮ | |
| 80 | #A7-b5 | #A15-b5 | #A7-b21 | #A15-b21 | #A7-b37 | #A15-b37 | #A7-b53 | #A15-b53 | |
| 79 | #A0-b6 | #A8-b6 | #A-b22 | #A8-b22 | #A0-b38 | #A8-b38 | #A0-b54 | #A8-b54 | |
| ⋮ | ⋮ | ⋮ | ⋮ | ⋮ | ⋮ | ⋮ | ⋮ | ⋮ | |
| 72 | #A7-b6 | #A15-b6 | #A7-b22 | #A15-b22 | #A7-b38 | #A15-b38 | #A7-b54 | #A15-b54 | |
| 71 | #A0-b7 | #A8-b7 | #A0-b23 | #A8-b23 | #A0-b39 | #A8-b39 | #A0-b55 | #A8-b55 | |
| ⋮ | ⋮ | ⋮ | ⋮ | ⋮ | ⋮ | ⋮ | ⋮ | ⋮ | |
| 64 | #A7-b7 | #A15-b7 | #A7-b23 | #A15-b23 | #A7-b39 | #A15-b39 | #A7-b55 | #A15-b55 | |
| 63 | #A0-b8 | #A8-b8 | #A-b240 | #A8-b24 | #A0-b40 | #A8-b40 | #A0-b56 | #A8-b56 | |
| ⋮ | ⋮ | ⋮ | ⋮ | ⋮ | ⋮ | ⋮ | ⋮ | ⋮ | |
| 56 | #A7-b8 | #A15-b8 | #A7-b24 | #A15-b24 | #A7-b40 | #A15-b40 | #A7-b56 | #A15-b56 | |
| 55 | #A0-b9 | #A8-b9 | #A0-b25 | #A8-b25 | #A0-b41 | #A8-b41 | #A0-b57 | #A8-b57 | |
| ⋮ | ⋮ | ⋮ | ⋮ | ⋮ | ⋮ | ⋮ | ⋮ | ⋮ | |
| 48 | #A7-b9 | #A15-b9 | #A7-b25 | #A15-b25 | #A7-b41 | #A15-b41 | #A7-b57 | #A15-b57 | |
| 47 | #A0-b10 | #A8-b10 | #A0-b26 | #A8-b26 | #A0-b42 | #A8-b42 | #A0-b58 | #A8-b58 | |
| ⋮ | ⋮ | ⋮ | ⋮ | ⋮ | ⋮ | ⋮ | ⋮ | ⋮ | |
| 40 | #A7-b10 | #A15-b10 | #A7-b26 | #A15-b26 | #A7-b42 | #A15-b42 | #A7-b58 | #A15-b58 | |
| 39 | #A0-b11 | #A8-b11 | #A0-b27 | #A8-b27 | #A0-b43 | #A8-b43 | #A0-b59 | #A8-b59 | |
| ⋮ | ⋮ | ⋮ | ⋮ | ⋮ | ⋮ | ⋮ | ⋮ | ⋮ | |
| 32 | #A7-b11 | #A15-b11 | #A7-b27 | #A15-b27 | #A7-b43 | #A15-b43 | #A7-b59 | #A15-b59 | |
| 31 | #A0-b12 | #A8-b12 | #A0-b28 | #A8-b28 | #A0-b44 | #A8-b44 | #A0-b60 | #A8-b60 | |
| ⋮ | ⋮ | ⋮ | ⋮ | ⋮ | ⋮ | ⋮ | ⋮ | ⋮ | |
| 24 | #A7-b12 | #A15-b12 | #A7-b28 | #A15-b28 | #A7-b44 | #A15-b44 | #A7-b60 | #A15-b60 | |
| 23 | #A0-b13 | #A8-b13 | #A0-b29 | #A8-b29 | #A0-b45 | #A8-b45 | #A0-b61 | #A8-b61 | |
| ⋮ | ⋮ | ⋮ | ⋮ | ⋮ | ⋮ | ⋮ | ⋮ | ⋮ | |
| 16 | #A7-b13 | #A15-b13 | #A7-b29 | #A15-b29 | #A7-b45 | #A15-b45 | #A7-b61 | #A15-b61 | |
| 15 | #A0-b14 | #A8-b14 | #A0-b30 | #A8-b30 | #A0-b46 | #A8-b46 | #A0-b62 | #A8-b62 | |
| ⋮ | ⋮ | ⋮ | ⋮ | ⋮ | ⋮ | ⋮ | ⋮ | ⋮ | |
| 8 | #A7-b14 | #A15-b14 | #A7-b30 | #A15-b30 | #A7-b46 | #A15-b46 | #A7-b62 | #A15-b62 | |
| 7 | #A0-b15 | #A8-b15 | #A0-b31 | #A8-b31 | #A0-b47 | #A8-b47 | #A0-b63 | #A8-b63 | |
| ⋮ | ⋮ | ⋮ | ⋮ | ⋮ | ⋮ | ⋮ | ⋮ | ⋮ | |
| 1 | #A6-b15 | #A14-b15 | #A6-b31 | #A14-b31 | #A6-b47 | #A14-b47 | #A6-b63 | #A14-b63 | |
| 0 | #A7-b15 | #A15-b15 | #A7-b31 | #A15-b31 | #A7-b47 | #A15-b47 | #A7-b63 | #A15-b63 | |

FIG. 11

| Row Number | Column Number 0 | 1 | 2 | 3 | 4 | 5 | 6 | 7 | .... |
|---|---|---|---|---|---|---|---|---|---|
| 127 | #B0-b0 | #A8-b0 | #B0-b16 | #A8-b16 | #B0-b32 | #A8-b32 | #B0-b48 | #A8-b48 | |
| 126 | #B1-b0 | #A9-b0 | #B1-b16 | #A9-b16 | #B1-b32 | #A9-b32 | #B1-b48 | #A9-b48 | |
| ⋮ | ⋮ | ⋮ | ⋮ | ⋮ | ⋮ | ⋮ | ⋮ | ⋮ | |
| 120 | #B7-b0 | #A15-b0 | #B7-b16 | #A15-b16 | #B7-b32 | #A15-b32 | #B7-b48 | #A15-b48 | |
| 119 | #B0-b1 | #B8-b1 | #B0-b17 | #B8-b17 | #B0-b33 | #B8-b33 | #B0-b49 | #B8-b49 | |
| ⋮ | ⋮ | ⋮ | ⋮ | ⋮ | ⋮ | ⋮ | ⋮ | ⋮ | |
| 112 | #B7-b1 | #B15-b1 | #B7-b17 | #B15-b17 | #B7-b33 | #B15-b33 | #B7-b49 | #B15-b49 | |
| 111 | #B0-b2 | #B8-b2 | #B0-b18 | #B8-b18 | #B0-b34 | #B8-b34 | #B0-b50 | #B8-b50 | |
| ⋮ | ⋮ | ⋮ | ⋮ | ⋮ | ⋮ | ⋮ | ⋮ | ⋮ | |
| 104 | #B7-b2 | #B15-b2 | #B7-b18 | #B15-b18 | #B7-b34 | #B15-b34 | #B7-b50 | #B15-b50 | |
| 103 | #B0-b3 | #B8-b3 | #B0-b19 | #B8-b19 | #B0-b35 | #B8-b35 | #B0-b51 | #B8-b51 | |
| ⋮ | ⋮ | ⋮ | ⋮ | ⋮ | ⋮ | ⋮ | ⋮ | ⋮ | |
| 96 | #B7-b3 | #B15-b3 | #B7-b19 | #B15-b19 | #B7-b35 | #B15-b35 | #B7-b51 | #B15-b51 | |
| 95 | #B0-b4 | #B8-b4 | #B0-b20 | #B8-b20 | #B0-b36 | #B8-b36 | #B0-b52 | #B8-b52 | |
| ⋮ | ⋮ | ⋮ | ⋮ | ⋮ | ⋮ | ⋮ | ⋮ | ⋮ | |
| 88 | #B7-b4 | #B15-b4 | #B7-b20 | #B15-b20 | #B7-b36 | #B15-b36 | #B7-b52 | #B15-b52 | |
| 87 | #B0-b5 | #B8-b5 | #B0-b21 | #B8-b21 | #B0-b37 | #B8-b37 | #B0-b53 | #B8-b53 | |
| ⋮ | ⋮ | ⋮ | ⋮ | ⋮ | ⋮ | ⋮ | ⋮ | ⋮ | |
| 80 | #B7-b5 | #B15-b5 | #B7-b21 | #B15-b21 | #B7-b37 | #B15-b37 | #B7-b53 | #B15-b53 | |
| 79 | #B0-b6 | #B8-b6 | #B0-b22 | #B8-b22 | #B0-b38 | #B8-b38 | #B0-b54 | #B8-b54 | |
| ⋮ | ⋮ | ⋮ | ⋮ | ⋮ | ⋮ | ⋮ | ⋮ | ⋮ | |
| 72 | #B7-b6 | #B15-b6 | #B7-b22 | #B15-b22 | #B7-b38 | #B15-b38 | #B7-b54 | #B15-b54 | |
| 71 | #B0-b7 | #B8-b7 | #B0-b23 | #B8-b23 | #B0-b39 | #B8-b39 | #B0-b55 | #B8-b55 | |
| ⋮ | ⋮ | ⋮ | ⋮ | ⋮ | ⋮ | ⋮ | ⋮ | ⋮ | |
| 64 | #B7-b7 | #B15-b7 | #B7-b23 | #B15-b23 | #B7-b39 | #B15-b39 | #B7-b55 | #B15-b55 | |
| 63 | #B0-b8 | #B8-b8 | #B0-b24 | #B8-b24 | #B0-b40 | #B8-b40 | #B0-b56 | #B8-b56 | |
| ⋮ | ⋮ | ⋮ | ⋮ | ⋮ | ⋮ | ⋮ | ⋮ | ⋮ | |
| 56 | #B7-b8 | #B15-b8 | #B7-b24 | #B15-b24 | #B7-b40 | #B15-b40 | #B7-b56 | #B15-b56 | |
| 55 | #B0-b9 | #B8-b9 | #B0-b25 | #B8-b25 | #B0-b41 | #B8-b41 | #B0-b57 | #B8-b57 | |
| ⋮ | ⋮ | ⋮ | ⋮ | ⋮ | ⋮ | ⋮ | ⋮ | ⋮ | |
| 48 | #B7-b9 | #B15-b9 | #B7-b25 | #B15-b25 | #B7-b41 | #B15-b41 | #B7-b57 | #B15-b57 | |
| 47 | #B0-b10 | #B8-b10 | #B0-b26 | #B8-b26 | #B0-b42 | #B8-b42 | #B0-b58 | #B8-b58 | |
| ⋮ | ⋮ | ⋮ | ⋮ | ⋮ | ⋮ | ⋮ | ⋮ | ⋮ | |
| 40 | #B7-b10 | #B15-b10 | #B7-b26 | #B15-b26 | #B7-b42 | #B15-b42 | #B7-b58 | #B15-b58 | |
| 39 | #B0-b11 | #B8-b11 | #B0-b27 | #B8-b27 | #B0-b43 | #B8-b43 | #B0-b59 | #B8-b59 | |
| ⋮ | ⋮ | ⋮ | ⋮ | ⋮ | ⋮ | ⋮ | ⋮ | ⋮ | |
| 32 | #B7-b11 | #B15-b11 | #B7-b27 | #B15-b27 | #B7-b43 | #B15-b43 | #B7-b59 | #B15-b59 | |
| 31 | #B0-b12 | #B8-b12 | #B0-b28 | #B8-b28 | #B0-b44 | #B8-b44 | #B0-b60 | #B8-b60 | |
| ⋮ | ⋮ | ⋮ | ⋮ | ⋮ | ⋮ | ⋮ | ⋮ | ⋮ | |
| 24 | #B7-b12 | #B15-b12 | #B7-b28 | #B15-b28 | #B7-b44 | #B15-b44 | #B7-b60 | #B15-b60 | |
| 23 | #B0-b13 | #B8-b13 | #B0-b29 | #B8-b29 | #B0-b45 | #B8-b45 | #B0-b61 | #B8-b61 | |
| ⋮ | ⋮ | ⋮ | ⋮ | ⋮ | ⋮ | ⋮ | ⋮ | ⋮ | |
| 16 | #B7-b13 | #B15-b13 | #B7-b29 | #B15-b29 | #B7-b45 | #B15-b45 | #B7-b61 | #B15-b61 | |
| 15 | #B0-b14 | #B8-b14 | #B0-b30 | #B8-b30 | #B0-b46 | #B8-b46 | #B0-b62 | #B8-b62 | |
| ⋮ | ⋮ | ⋮ | ⋮ | ⋮ | ⋮ | ⋮ | ⋮ | ⋮ | |
| 8 | #B7-b14 | #B15-b14 | #B7-b30 | #B15-b30 | #B7-b46 | #B15-b46 | #B7-b62 | #B15-b62 | |
| 7 | #B0-b15 | #B8-b15 | #B0-b31 | #B8-b31 | #B0-b47 | #B8-b47 | #B0-b63 | #B8-b63 | |
| ⋮ | ⋮ | ⋮ | ⋮ | ⋮ | ⋮ | ⋮ | ⋮ | ⋮ | |
| 1 | #B6-b15 | #B14-b15 | #B6-b31 | #B14-b31 | #B6-b47 | #B14-b47 | #B6-b63 | #B14-b63 | |
| 0 | #B7-b15 | #B15-b15 | #B7-b31 | #B15-b31 | #B7-b47 | #B15-b47 | #B7-b63 | #B15-b63 | |

FIG. 14

| Row Number | Column Number 0 | 1 | 2 | 3 | 4 | 5 | 6 | .... |
|---|---|---|---|---|---|---|---|---|
| 511 | #A0-b0 | #A8-b0 | #A16-b0 | #A24-b0 | #A0-b16 | #A8-b16 | #A16-b16 | |
| 510 | #A1-b0 | #A9-b0 | #A17-b0 | #A25-b0 | #A1-b16 | #A9-b16 | #A17-b16 | |
| ⋮ | ⋮ | ⋮ | ⋮ | ⋮ | ⋮ | ⋮ | ⋮ | |
| 504 | #A7-b0 | #A15-b0 | #A23-b0 | #A31-b0 | #A7-b16 | #A15-b16 | #A23-b16 | |
| 503 | #A0-b1 | #A8-b1 | #A16-b1 | #A24-b1 | #A0-b17 | #A8-b17 | #A16-b17 | |
| ⋮ | ⋮ | ⋮ | ⋮ | ⋮ | ⋮ | ⋮ | ⋮ | |
| ⋮ | ⋮ | ⋮ | ⋮ | ⋮ | ⋮ | ⋮ | ⋮ | |
| 391 | #A0-b15 | #A8-b15 | #A16-b15 | #A24-b15 | #A0-b31 | #A8-b31 | #A16-b31 | |
| 390 | #A1-b15 | #A9-b15 | #A17-b15 | #A25-b15 | #A1-b31 | #A9-b31 | #A17-b31 | |
| ⋮ | ⋮ | ⋮ | ⋮ | ⋮ | ⋮ | ⋮ | ⋮ | |
| 384 | #A7-b15 | #A15-b15 | #A23-b15 | #A31-b15 | #A7-b31 | #A15-b31 | #A23-b31 | |
| 383 | #A32-b0 | #A40-b0 | #A48-b0 | #A56-b0 | #A32-b16 | #A40-b16 | #A48-b16 | |
| 382 | #A33-b0 | #A41-b0 | #A49-b0 | #A57-b0 | #A33-b16 | #A41-b16 | #A49-b16 | |
| ⋮ | ⋮ | ⋮ | ⋮ | ⋮ | ⋮ | ⋮ | ⋮ | |
| 376 | #A39-b0 | #A47-b0 | #A55-b0 | #A63-b0 | #A39-b16 | #A47-b16 | #A55-b16 | |
| 375 | #A32-b1 | #A40-b1 | #A48-b1 | #A56-b1 | #A32-b17 | #A40-b17 | #A48-b17 | |
| ⋮ | ⋮ | ⋮ | ⋮ | ⋮ | ⋮ | ⋮ | ⋮ | |
| ⋮ | ⋮ | ⋮ | ⋮ | ⋮ | ⋮ | ⋮ | ⋮ | |
| 263 | #A32-b15 | #A40-b15 | #A48-b15 | #A56-b15 | #A32-b31 | #A40-b31 | #A48-b31 | |
| 262 | #A33-b15 | #A41-b15 | #A49-b15 | #A57-b15 | #A33-b31 | #A41-b31 | #A49-b31 | |
| ⋮ | ⋮ | ⋮ | ⋮ | ⋮ | ⋮ | ⋮ | ⋮ | |
| 256 | #A39-b15 | #A47-b15 | #A55-b15 | #A63-b15 | #A39-b31 | #A47-b31 | #A55-b31 | |
| 255 | #A64-b0 | #A72-b0 | #A80-b0 | #A88-b0 | #A64-b16 | #A72-b16 | #A80-b16 | |
| 254 | #A65-b0 | #A73-b0 | #A81-b0 | #A89-b0 | #A65-b16 | #A73-b16 | #A81-b16 | |
| ⋮ | ⋮ | ⋮ | ⋮ | ⋮ | ⋮ | ⋮ | ⋮ | |
| 248 | #A71-b0 | #A79-b0 | #A87-b0 | #A95-b0 | #A71-b16 | #A79-b16 | #A87-b16 | |
| 247 | #A64-b1 | #A72-b1 | #A80-b1 | #A88-b1 | #A64-b17 | #A72-b17 | #A80-b17 | |
| ⋮ | ⋮ | ⋮ | ⋮ | ⋮ | ⋮ | ⋮ | ⋮ | |
| ⋮ | ⋮ | ⋮ | ⋮ | ⋮ | ⋮ | ⋮ | ⋮ | |
| 135 | #A64-b15 | #A72-b15 | #A80-b15 | #A88-b15 | #A64-b31 | #A72-b31 | #A80-b31 | |
| 134 | #A65-b15 | #A73-b15 | #A81-b15 | #A89-b15 | #A65-b31 | #A73-b31 | #A81-b31 | |
| ⋮ | ⋮ | ⋮ | ⋮ | ⋮ | ⋮ | ⋮ | ⋮ | |
| 128 | #A71-b15 | #A79-b15 | #A87-b15 | #A95-b15 | #A71-b31 | #A79-b31 | #A87-b31 | |
| 127 | #A96-b0 | #A104-b0 | #A112-b0 | #A120-b0 | #A96-b16 | #A104-b16 | #A112-b16 | |
| 126 | #A97-b0 | #A105-b0 | #A113-b0 | #A121-b0 | #A97-b16 | #A105-b16 | #A113-b16 | |
| ⋮ | ⋮ | ⋮ | ⋮ | ⋮ | ⋮ | ⋮ | ⋮ | |
| 120 | #A103-b0 | #A111-b0 | #A119-b0 | #A127-b0 | #A103-b16 | #A111-b16 | #A119-b16 | |
| 119 | #A96-b1 | #A104-b1 | #A112-b1 | #A120-b1 | #A96-b17 | #A104-b17 | #A112-b17 | |
| ⋮ | ⋮ | ⋮ | ⋮ | ⋮ | ⋮ | ⋮ | ⋮ | |
| ⋮ | ⋮ | ⋮ | ⋮ | ⋮ | ⋮ | ⋮ | ⋮ | |
| 7 | #A96-b15 | #A104-b15 | #A112-b15 | #A120-b15 | #A96-b31 | #A104-b31 | #A112-b31 | |
| 6 | #A97-b15 | #A105-b15 | #A113-b15 | #A121-b15 | #A97-b31 | #A105-b31 | #A113-b31 | |
| ⋮ | ⋮ | ⋮ | ⋮ | ⋮ | ⋮ | ⋮ | ⋮ | |
| 0 | #A103-b15 | #A111-b15 | #A119-b15 | #A127-b15 | #A103-b31 | #A111-b31 | #A119-b31 | |

FIG. 16

| Row Number | Column Number 0 | 1 | 2 | 3 | 4 | 5 | 6 | .... |
|---|---|---|---|---|---|---|---|---|
| 511 | #A0-b0 | #A8-b0 | #A0-b16 | #A8-b16 | #A0-b32 | #A8-b32 | #A0-b48 | |
| 510 | #A1-b0 | #A9-b0 | #A1-b16 | #A9-b16 | #A1-b32 | #A9-b32 | #A1-b48 | |
| ⋮ | ⋮ | ⋮ | ⋮ | ⋮ | ⋮ | ⋮ | ⋮ | |
| 504 | #A7-b0 | #A15-b0 | #A7-b16 | #A15-b16 | #A7-b32 | #A15-b32 | #A7-b48 | |
| 503 | #A0-b1 | #A8-b1 | #A0-b17 | #A8-b17 | #A0-b33 | #A8-b33 | #A0-b49 | |
| ⋮ | ⋮ | ⋮ | ⋮ | ⋮ | ⋮ | ⋮ | ⋮ | |
| ⋮ | ⋮ | ⋮ | ⋮ | ⋮ | ⋮ | ⋮ | ⋮ | |
| 391 | #A0-b15 | #A8-b15 | #A0-b31 | #A8-b31 | #A0-b47 | #A8-b47 | #A0-b63 | |
| 390 | #A1-b15 | #A9-b15 | #A1-b31 | #A9-b31 | #A1-b47 | #A9-b47 | #A1-b63 | |
| ⋮ | ⋮ | ⋮ | ⋮ | ⋮ | ⋮ | ⋮ | ⋮ | |
| 384 | #A7-b15 | #A15-b15 | #A7-b31 | #A15-b31 | #A7-b47 | #A15-b47 | #A7-b63 | |
| 383 | #A16-b0 | #A24-b0 | #A16-b16 | #A24-b16 | #A16-b32 | #A24-b32 | #A16-b48 | |
| 382 | #A17-b0 | #A25-b0 | #A17-b16 | #A25-b16 | #A17-b32 | #A25-b32 | #A17-b48 | |
| ⋮ | ⋮ | ⋮ | ⋮ | ⋮ | ⋮ | ⋮ | ⋮ | |
| 376 | #A23-b0 | #A31-b0 | #A23-b16 | #A31-b16 | #A23-b32 | #A31-b32 | #A23-b48 | |
| 375 | #A16-b1 | #A24-b1 | #A16-b17 | #A24-b17 | #A16-b33 | #A24-b33 | #A16-b49 | |
| ⋮ | ⋮ | ⋮ | ⋮ | ⋮ | ⋮ | ⋮ | ⋮ | |
| ⋮ | ⋮ | ⋮ | ⋮ | ⋮ | ⋮ | ⋮ | ⋮ | |
| 263 | #A16-b15 | #A24-b15 | #A16-b31 | #A24-b31 | #A16-b47 | #A24-b47 | #A16-b63 | |
| 262 | #A17-b15 | #A25-b15 | #A17-b31 | #A25-b31 | #A17-b47 | #A25-b47 | #A17-b63 | |
| ⋮ | ⋮ | ⋮ | ⋮ | ⋮ | ⋮ | ⋮ | ⋮ | |
| 256 | #A23-b15 | #A31-b15 | #A23-b31 | #A31-b31 | #A23-b47 | #A31-b47 | #A23-b63 | |
| 255 | #A32-b0 | #A40-b0 | #A32-b16 | #A40-b16 | #A32-b32 | #A40-b32 | #A32-b48 | |
| 254 | #A33-b0 | #A41-b0 | #A33-b16 | #A41-b16 | #A33-b32 | #A41-b32 | #A33-b48 | |
| ⋮ | ⋮ | ⋮ | ⋮ | ⋮ | ⋮ | ⋮ | ⋮ | |
| 248 | #A39-b0 | #A47-b0 | #A39-b16 | #A47-b16 | #A39-b32 | #A47-b32 | #A39-b48 | |
| 247 | #A32-b1 | #A40-b1 | #A32-b17 | #A40-b17 | #A32-b33 | #A40-b33 | #A32-b49 | |
| ⋮ | ⋮ | ⋮ | ⋮ | ⋮ | ⋮ | ⋮ | ⋮ | |
| ⋮ | ⋮ | ⋮ | ⋮ | ⋮ | ⋮ | ⋮ | ⋮ | |
| 135 | #A32-b15 | #A40-b15 | #A32-b31 | #A40-b31 | #A32-b47 | #A40-b47 | #A32-b63 | |
| 134 | #A33-b15 | #A41-b15 | #A33-b31 | #A41-b31 | #A33-b47 | #A41-b47 | #A33-b63 | |
| ⋮ | ⋮ | ⋮ | ⋮ | ⋮ | ⋮ | ⋮ | ⋮ | |
| 128 | #A39-b15 | #A47-b15 | #A39-b31 | #A47-b31 | #A39-b47 | #A47-b47 | #A39-b63 | |
| 127 | #A48-b0 | #A56-b0 | #A48-b16 | #A56-b16 | #A48-b32 | #A56-b32 | #A48-b48 | |
| 126 | #A49-b0 | #A57-b0 | #A49-b16 | #A57-b16 | #A49-b32 | #A57-b32 | #A49-b48 | |
| ⋮ | ⋮ | ⋮ | ⋮ | ⋮ | ⋮ | ⋮ | ⋮ | |
| 120 | #A55-b0 | #A63-b0 | #A55-b16 | #A63-b16 | #A55-b32 | #A63-b32 | #A55-b48 | |
| 119 | #A48-b1 | #A56-b1 | #A48-b17 | #A56-b17 | #A48-b33 | #A56-b33 | #A48-b49 | |
| ⋮ | ⋮ | ⋮ | ⋮ | ⋮ | ⋮ | ⋮ | ⋮ | |
| ⋮ | ⋮ | ⋮ | ⋮ | ⋮ | ⋮ | ⋮ | ⋮ | |
| 7 | #A48-b15 | #A56-b15 | #A48-b31 | #A56-b31 | #A48-b47 | #A56-b47 | #A48-b63 | |
| 6 | #A49-b15 | #A57-b15 | #A49-b31 | #A57-b31 | #A49-b47 | #A57-b47 | #A49-b63 | |
| ⋮ | ⋮ | ⋮ | ⋮ | ⋮ | ⋮ | ⋮ | ⋮ | |
| 0 | #A55-b15 | #A63-b15 | #A55-b31 | #A63-b31 | #A55-b47 | #A63-b47 | #A55-b63 | |

FIG. 17

| Row Number | Column Number 0 | 1 | 2 | 3 | 4 | 5 | 6 | .... |
|---|---|---|---|---|---|---|---|---|
| 511 | #B0-b0 | #B8-b0 | #B0-b16 | #B8-b16 | #B0-b32 | #B8-b32 | #B0-b48 | |
| 510 | #B1-b0 | #B9-b0 | #B1-b16 | #B9-b16 | #B1-b32 | #B9-b32 | #B1-b48 | |
| ⋮ | ⋮ | ⋮ | ⋮ | ⋮ | ⋮ | ⋮ | ⋮ | |
| 504 | #B7-b0 | #B15-b0 | #B7-b16 | #B15-b16 | #B7-b32 | #B15-b32 | #B7-b48 | |
| 503 | #B0-b1 | #B8-b1 | #B0-b17 | #B8-b17 | #B0-b33 | #B8-b33 | #B0-b49 | |
| ⋮ | ⋮ | ⋮ | ⋮ | ⋮ | ⋮ | ⋮ | ⋮ | |
| ⋮ | ⋮ | ⋮ | ⋮ | ⋮ | ⋮ | ⋮ | ⋮ | |
| 391 | #B0-b15 | #B8-b15 | #B0-b31 | #B8-b31 | #B0-b47 | #B8-b47 | #B0-b63 | |
| 390 | #B1-b15 | #B9-b15 | #B1-b31 | #B9-b31 | #B1-b47 | #B9-b47 | #B1-b63 | |
| ⋮ | ⋮ | ⋮ | ⋮ | ⋮ | ⋮ | ⋮ | ⋮ | |
| 384 | #B7-b15 | #B15-b15 | #B7-b31 | #B15-b31 | #B7-b47 | #B15-b47 | #B7-b63 | |
| 383 | #B16-b0 | #B24-b0 | #B16-b16 | #B24-b16 | #B16-b32 | #B24-b32 | #B16-b48 | |
| 382 | #B17-b0 | #B25-b0 | #B17-b16 | #B25-b16 | #B17-b32 | #B25-b32 | #B17-b48 | |
| ⋮ | ⋮ | ⋮ | ⋮ | ⋮ | ⋮ | ⋮ | ⋮ | |
| 376 | #B23-b0 | #B31-b0 | #B23-b16 | #B31-b16 | #B23-b32 | #B31-b32 | #B23-b48 | |
| 375 | #B16-b1 | #B24-b1 | #B16-b17 | #B24-b17 | #B16-b33 | #B24-b33 | #B16-b49 | |
| ⋮ | ⋮ | ⋮ | ⋮ | ⋮ | ⋮ | ⋮ | ⋮ | |
| ⋮ | ⋮ | ⋮ | ⋮ | ⋮ | ⋮ | ⋮ | ⋮ | |
| 263 | #B16-b15 | #B24-b15 | #B16-b31 | #B24-b31 | #B16-b47 | #B24-b47 | #B16-b63 | |
| 262 | #B17-b15 | #B25-b15 | #B17-b31 | #B25-b31 | #B17-b47 | #B25-b47 | #B17-b63 | |
| ⋮ | ⋮ | ⋮ | ⋮ | ⋮ | ⋮ | ⋮ | ⋮ | |
| 256 | #B23-b15 | #B31-b15 | #B23-b31 | #B31-b31 | #B23-b47 | #B31-b47 | #B23-b63 | |
| 255 | #B32-b0 | #B40-b0 | #B32-b16 | #B40-b16 | #B32-b32 | #B40-b32 | #B32-b48 | |
| 254 | #B33-b0 | #B41-b0 | #B33-b16 | #B41-b16 | #B33-b32 | #B41-b32 | #B33-b48 | |
| ⋮ | ⋮ | ⋮ | ⋮ | ⋮ | ⋮ | ⋮ | ⋮ | |
| 248 | #B39-b0 | #B47-b0 | #B39-b16 | #B47-b16 | #B39-b32 | #B47-b32 | #B39-b48 | |
| 247 | #B32-b1 | #B40-b1 | #B32-b17 | #B40-b17 | #B32-b33 | #B40-b33 | #B32-b49 | |
| ⋮ | ⋮ | ⋮ | ⋮ | ⋮ | ⋮ | ⋮ | ⋮ | |
| ⋮ | ⋮ | ⋮ | ⋮ | ⋮ | ⋮ | ⋮ | ⋮ | |
| 135 | #B32-b15 | #B40-b15 | #B32-b31 | #B40-b31 | #B32-b47 | #B40-b47 | #B32-b63 | |
| 134 | #B33-b15 | #B41-b15 | #B33-b31 | #B41-b31 | #B33-b47 | #B41-b47 | #B33-b63 | |
| ⋮ | ⋮ | ⋮ | ⋮ | ⋮ | ⋮ | ⋮ | ⋮ | |
| 128 | #B39-b15 | #B47-b15 | #B39-b31 | #B47-b31 | #B39-b47 | #B47-b47 | #B39-b63 | |
| 127 | #B48-b0 | #B56-b0 | #B48-b16 | #B56-b16 | #B48-b32 | #B56-b32 | #B48-b48 | |
| 126 | #B49-b0 | #B57-b0 | #B49-b16 | #B57-b16 | #B49-b32 | #B57-b32 | #B49-b48 | |
| ⋮ | ⋮ | ⋮ | ⋮ | ⋮ | ⋮ | ⋮ | ⋮ | |
| 120 | #B55-b0 | #B63-b0 | #B55-b16 | #B63-b16 | #B55-b32 | #B63-b32 | #B55-b48 | |
| 119 | #B48-b1 | #B56-b1 | #B48-b17 | #B56-b17 | #B48-b33 | #B56-b33 | #B48-b49 | |
| ⋮ | ⋮ | ⋮ | ⋮ | ⋮ | ⋮ | ⋮ | ⋮ | |
| ⋮ | ⋮ | ⋮ | ⋮ | ⋮ | ⋮ | ⋮ | ⋮ | |
| 7 | #B48-b15 | #B56-b15 | #B48-b31 | #B56-b31 | #B48-b47 | #B56-b47 | #B48-b63 | |
| 6 | #B49-b15 | #B57-b15 | #B49-b31 | #B57-b31 | #B49-b47 | #B57-b47 | #B49-b63 | |
| ⋮ | ⋮ | ⋮ | ⋮ | ⋮ | ⋮ | ⋮ | ⋮ | |
| 0 | #B55-b15 | #B63-b15 | #B55-b31 | #B63-b31 | #B55-b47 | #B63-b47 | #B55-b63 | |

ENCODER DEVICE, DECODER DEVICE AND TRANSMISSION APPARATUS

TECHNICAL FIELD

The present invention relates to error correction techniques for correcting errors occurring in the bits of digital data, and more particularly, relates to error correction techniques used for digital communications such as optical communications.

BACKGROUND ART

Error correction techniques are widely adopted as techniques for correcting errors in the bits of digital data which occurs in a system, such as a digital communication system, an information storage system or a computer system. For example, in ITU-T Recommendation G.709 (Non-Patent Literature 1) which defines the specifications of an optical transport network interface, the format of an OTUk (Optical channel Transport Unit-k) frame which is a type of optical transport frame is defined, and, in this OTUk frame, forward error correction (FEC) codes are added to a payload containing a client signal. The value "k" in OTUk is determined depending on the transmission speed, and is an integer ranging between 1 and 4. For example, in the case of data transmission using OTU1 frames, a transmission speed of approximately 2.5 Gigabit/sec per one data sequence can be secured. 1 Gigabit/sec means 1 Giga-bit per second. In the case of data transmission using OTU4 frames, a transmission speed of 100 Gigabit/sec or more per one data sequence can be secured.

Further, for an improvement in the characteristics of forward error correction, there is also provided a technique for performing interleaving on a bit sequence which is a target for error-correction coding. For example, Patent Literature 1 (Japanese Patent Application Publication No. 2011-146932) discloses an error correction encoder that includes an interleaver circuit for performing interleaving to rearrange the order of bit sequences of transmission data, an encoding circuit for applying error-correction coding to an output of the interleaver circuit, and a deinterleaver circuit for changing the order of output bit sequences in the encoding circuit to the original order existed prior to the interleaving.

CITATION LIST

Patent Literature

Patent Literature 1: Japanese Patent Application Publication No. 2011-146932 (for example, FIG. 3 and paragraphs [0047] to [0061]).

Non-Patent Literature

Non-Patent Literature 1: ITU-T Recommendation G.709/Y.1331, "Interfaces for the optical transport network."

SUMMARY OF INVENTION

Technical Problem

An improvement in the transmission speed of a communication device is required with increase in the traffic demand in a communication network in recent years, and therefore there is a case in which there arises a necessity to change the transmission speed of the communication device in accordance with the state of the communication network. In this case, the execution speed of the error-correction coding also needs to be changed in accordance with the change of the transmission speed. For example, when the transmission speed is changed from 100 Gigabit/sec to 200 Gigabit/sec which is twice 100 Gigabit/sec, it is necessary to change the execution speed of the error-correction coding to twice or more times the execution speed in accordance with the transmission speed of 200 Gigabit/sec.

There is, however, the problem that in a case in which the circuit is designed so as to make it possible to change the execution speed of the error-correction coding, there causes an increase in the scale of circuits and an increase in the cost of the communication device. For example, in a case in which two error correction encoders disclosed in Patent Literature 1 are mounted in one communication device, an operation mode in which these two error correction encoders operate in parallel and the other operation mode in which only one of the error correction encoders operates can be implemented. By switching from one of these operation modes to the other operation mode, the execution speed of the error-correction coding can be changed to twice or a half times the execution speed. The problem is however that, because the two error correction encoders capable of operating in parallel are mounted, the scale of the whole circuit becomes large.

In view of the foregoing, it is an object of the present invention to provide an encoder device, decoder device and transmission apparatus which are capable of changing the execution speed of error-correction coding while avoiding an increase in the scale of circuits.

Solution to Problem

According to a first aspect of the present invention, there is provided an encoder device that operates in either a standard speed mode or a K-times speed mode where K is an integer larger than or equal to 2, and that applies error-correction coding to plural transmission frames, each transmission frame having a format of a bit array in row and column directions. The encoder device includes: an interleaver circuit configured to, when a single series of plural transmission frames is input in the standard speed mode, perform a first interleaving operation to rearrange an order of bit sequences of the single series of transmission frames thereby to output a single series of yet-to-be-coded bit sequences, and configured to, when K series of transmission frames into which the single series of plural transmission frames is divided are inputted in the K-times speed mode, perform a second interleaving operation to change orders of bit sequences of the K series of transmission frames, thereby to output K series of yet-to-be-coded bit sequences in parallel; a group of encoding circuits configured to apply error-correction coding to either the single series of yet-to-be-coded bit sequences or the K series of yet-to-be-coded bit sequences; and a deinterleaver circuit configured to perform a deinterleaving operation on output sequences outputted from the group of encoding circuits, wherein the interleaver circuit generates, in the standard speed mode, the single series of yet-to-be-coded bit sequences on a basis of bits in plural columns that are arranged at an interval of C columns in the single series of transmission frames where C is an integral multiple of K, and generates, in the K-times speed mode, each of the K series of yet-to-be-coded bit sequences on a basis of bits in plural columns that are arranged at an interval of C/K columns in each of the K series of transmission frames.

According to a second aspect of the present invention, there is provided a decoder device that operates in either a standard speed mode or a K-times speed mode where K is an integer larger than or equal to 2, and that performs error-correction decoding on plural reception frames, each reception frame having a format of a received value arrangement in row and column directions. The decoder device includes: an interleaver circuit configured to, when a single series of plural reception frames is input in the standard speed mode, perform a first interleaving operation to rearrange an order of received value sequences of the single series of reception frames, thereby to output a single series of received value sequences, and configured to, when K series of reception frames into which the single series of plural reception frames is divided are input in the K-times speed mode, perform a second interleaving operation to rearrange an order of received value sequences of the K series of reception frames, thereby to output K series of received value sequences in parallel; a group of decoding circuits configured to perform error-correction decoding on either the single series of received value sequences or the K series of received value sequences; and a deinterleaver circuit configured to perform a deinterleaving operation on output sequences outputted from the group of decoding circuits, wherein the interleaver circuit generates, in the standard speed mode, the single series of received value sequences on a basis of received values in plural columns that are arranged at an interval of C columns in the single series of reception frames where C is an integral multiple of K, and generates, in the K-times speed mode, each of the K series of received value sequences on a basis of received values in plural columns that are arranged at an interval of C/K columns in each of the K series of reception frames.

According to a third aspect of the present invention, there is provided a transmission apparatus that includes a transmitting circuit configured to convert output sequences outputted from the encoder device according to the first aspect, into a transmission signal.

According to a fourth aspect of the present invention, there is provided a reception apparatus that includes: a receiving circuit configured to receive the transmission signal from the transmission apparatus, and to output reception frames corresponding to the transmission frames; and the decoder device configured to perform error-correction decoding on the reception frames.

Advantageous Effects of Invention

According to the present invention, in the standard speed mode, a single series of yet-to-be-coded bit sequences is generated on the basis of bits in plural columns that are arranged at an interval of C columns in a single series of transmission frames. On the other hand, in the K-times speed mode, each of K series of yet-to-be-coded bit sequences is generated on the basis of bits in plural columns that are arranged at an interval of one K-th of the C columns, i.e., at an interval of C/K columns in each series of transmission frames. Thus, the temporary storage capacity for transmission frames required for the second interleaving operation in the K-times speed mode can be reduced. Therefore, error-correction coding which makes it possible to change the execution speed can be implemented while avoiding an increase in the scale of circuits.

BRIEF DESCRIPTION OF DRAWINGS

FIGS. 5A and 5B are diagrams showing the format of an OTUk frame;

FIG. 8 is a diagram illustrating a state in which the bits of yet-to-be-coded bit sequences are assigned to transmission frames;

FIGS. 9A and 9B are diagrams showing transmission frames which are transmitted in a two-times (double) speed mode;

FIG. 10 is a diagram illustrating a state in which the bits of yet-to-be-coded bit sequences are assigned to transmission frames in the two-times speed mode;

FIG. 11 is a diagram illustrating a state in which the bits of yet-to-be-coded bit sequences are assigned to transmission frames in the two-times speed mode;

FIG. 14 is a diagram illustrating a state in which the bits of yet-to-be-coded bit sequences are assigned to transmission frames having a parallel number of 512 in the standard speed mode;

FIG. 16 is a diagram illustrating a state in which the bits of yet-to-be-coded bit sequences are assigned to transmission frames having a parallel number of 512 in the two-times speed mode;

FIG. 17 is a diagram illustrating a state in which the bits of yet-to-be-coded bit sequences are assigned to transmission frames having a parallel number of 512 in the two-times speed mode;

DESCRIPTION OF EMBODIMENTS

Figure 1:
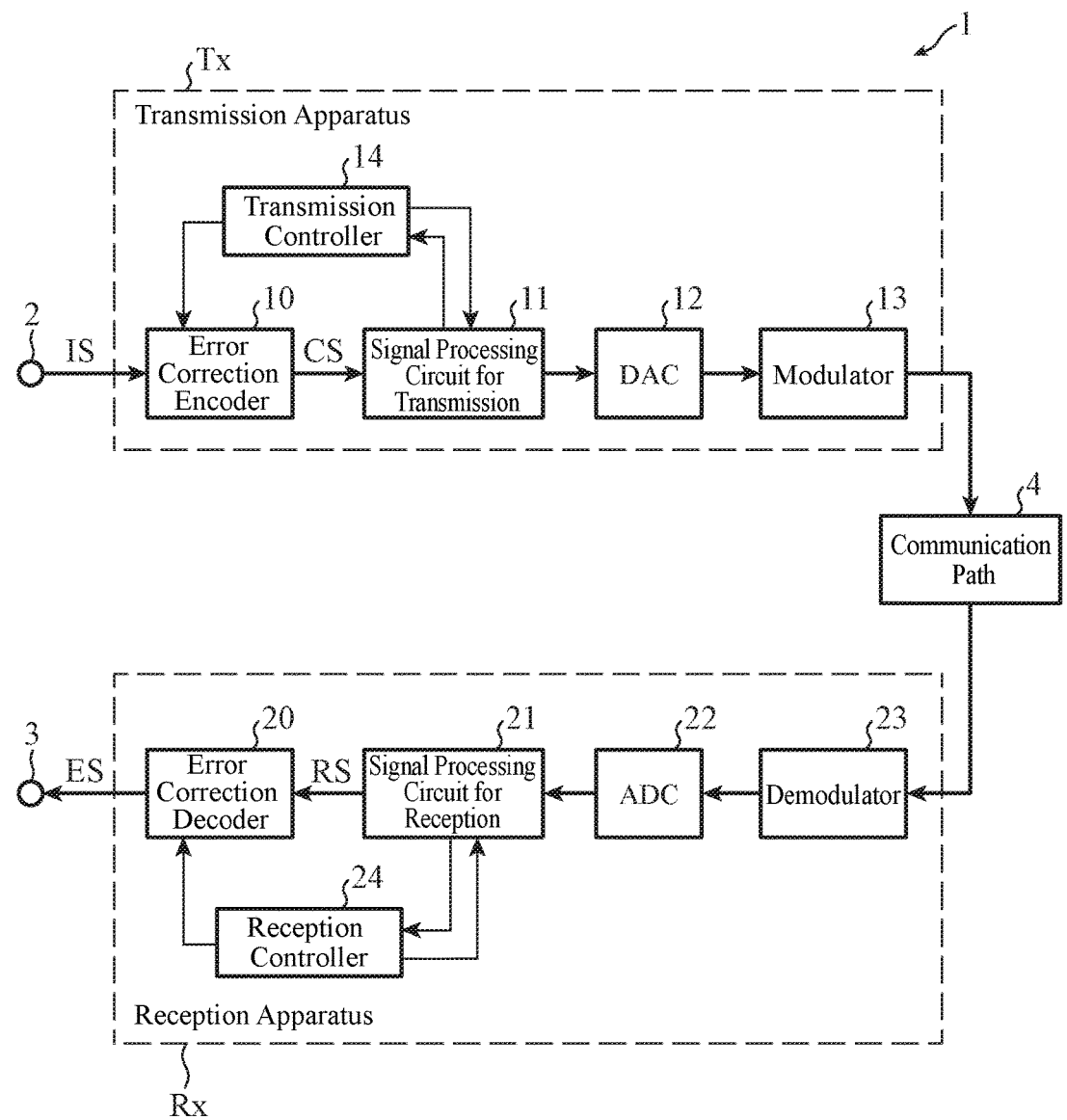
FIG. 1 is a functional block diagram showing the schematic configuration of a digital transmission system according to Embodiment 1 of the present invention.

Hereafter, various embodiments according to the present invention will be explained in detail with reference to drawings. It is assumed that components denoted by the same reference numerals in the whole of the drawings have the same configurations and the same functions.

Embodiment 1

FIG. 1 is a functional block diagram showing the schematic configuration of a digital transmission system 1 (simply referred to as a "transmission system 1" from here on) according to Embodiment 1 of the present invention. The transmission system 1 shown in FIG. 1 includes a transmission apparatus Tx that converts an information signal IS input thereto from an information source 2 into a modulated signal such as a light signal and that sends the modulated signal to a communication path 4, and a reception apparatus Rx that receives the modulated signal input thereto via the communication path 4. The information source 2 can furnish one or two series of digital signals, as the information signal IS, to an error correction encoder 10 in accordance with a transmission speed set to the transmission apparatus Tx. As will be mentioned below, according to this embodiment, when the transmission speed is set to a standard speed, the information source 2 furnishes a single series of a digital signal. In contrast, when the transmission speed is set to a two-times speed, the information source 2 divides the single series of a digital signal into two series of digital signals and furnishes these digital signals to the error correction encoder 10 in parallel. The configuration of the transmission apparatus Tx can be modified in such a way that the information source 2 is a component of the transmission apparatus Tx.

The transmission apparatus Tx includes: the error correction encoder 10 that performs a coding operation on an information signal IS input thereto, thereby to generate a coded signal CS; a transmitting circuit that converts an output of this error correction encoder 10 into a modulated signal for transmission, and sends the modulated signal to the communication path 4; and a transmission controller 14. The transmitting circuit is comprised of: a signal processing circuit 11 for transmission that performs a transmission-signal-point mapping operation and a digital signal processing on the coded signal CS, thereby to generate a single series of a digital transmission signal; a D/A converter (DAC) 12 that converts the digital transmission signal into an analog transmission signal; and a modulator 13 that generates a modulated signal from the analog transmission signal and sends the modulated signal to the communication path 4. In a case in which the transmission system 1 is an optical transmission system, the modulator 13 can generate modulated light by modulating either the intensity or phase of light, or both the intensity and phase of light, using the analog transmission signal in accordance with a multi-level modulation method such as multi-level QAM (Quadrature Amplitude Modulation) or QPSK (Quadrature Phase-Shift Keying), and send the modulated light to the communication path 4 such as an optical fiber. The multi-level modulation method is not limited to the above-mentioned multi-level QAM or the above-mentioned QPSK as long as the multi-level modulation method makes it possible to ensure a desired transmission speed.

The transmission apparatus Tx according to this embodiment has two types of operation modes including a standard speed mode in which the transmission apparatus transmits an information signal IS at a standard speed (for example, 100 Gigabit/sec), and a two-times speed mode in which the transmission apparatus transmits an information signal IS at a transmission speed twice the standard speed (for example, 200 Gigabit/sec). The transmission controller 14 causes the transmission apparatus Tx to operate in either the standard speed mode or the two-times speed mode in accordance with the set transmission speed (either the standard speed or two times the standard speed). As will be mentioned below, when the transmission apparatus Tx operates in the standard speed mode, the error correction encoder 10 receives a single series of information sequences from the information source 2 and outputs a single series of code sequences. In contrast, when the transmission apparatus Tx operates in the two-times speed mode, the error correction encoder 10 receives two series of information sequences from the information source 2 and outputs two series of code sequences. Further, the transmission controller 14 can furnish communication control information including information indicating an operation mode to the signal processing circuit 11 for transmission. The signal processing circuit 11 for transmission multiplexes two series of transmission code sequences and the communication control information, thereby to generate a single series of a digital transmission signal.

The hardware configuration of each of the following components: the error correction encoder 10 and the signal processing circuit 11 for transmission can be implemented by, for example, a DSP (Digital Signal Processor), an ASIC (Application Specific Integrated Circuit), an FPGA (Field-Programmable Gate Array), or a combination of some of them. Further, each of the following components: the signal processing circuit 11 for transmission, the DAC 12 and the modulator 13 should just have a circuit configuration which is typically used in a well-known digital transmission system.

On the other hand, the reception apparatus Rx includes: a receiving circuit that receives, via the communication path 4, the modulated signal sent thereto from the transmission apparatus Tx; an error correction decoder 20 that performs error-correction decoding on output sequences from this receiving circuit, thereby to output an estimated information signal ES; and a reception controller 24. The receiving circuit is comprised of a demodulator 23 that demodulates the modulated signal received thereby and outputs an analog received signal, an A/D converter (ADC) 22 that converts the analog received signal into a digital received signal, and a signal processing circuit 21 for reception that receives the digital received signal as an input thereof. The signal processing circuit 21 for reception performs signal processing, this signal processing including digital signal processing, a received-signal-point demapping operation, demultiplexing and a frame synchronizing operation, on the digital received signal, to generate a received signal RS, and outputs this received signal RS to the error correction decoder 20.

The reception controller 24 causes the reception apparatus Rx to operate in either the standard speed mode or the two-times speed mode in accordance with the operation mode of the transmission apparatus Tx (either the standard speed mode or the two-times speed mode). Further, the signal processing circuit 21 for reception can demultiplex the digital received signal into the above-mentioned communication control information, and furnish this communication control information to the reception controller 24. The reception controller 24 can determine the operation mode of the transmission apparatus Tx on the basis of this communication control information. As will be mentioned below, when the operation mode of the transmission apparatus Tx is the standard speed mode, the signal processing circuit 11 for transmission outputs a single series of received value sequences in parallel to the error correction decoder 20. The error correction decoder 20 performs error-correction decoding on the single series of received value sequences and outputs a single series of estimated bit sequences to a receiver 3. In contrast, when the operation mode of the transmission apparatus Tx is the two-times speed mode, the signal processing circuit 11 for transmission outputs two series of received value sequences in parallel to the error correction decoder 20. The error correction decoder 20 performs error-correction decoding on the two series of received value sequences and outputs two series of estimated bit sequences to the receiver 3.

The hardware configuration of each of the following components: the error correction decoder 20 and the signal processing circuit 21 for reception can be implemented by, for example, a DSP, an ASIC, an FPGA or a combination of some of them. Further, each of the following components: the signal processing circuit 21 for reception, the ADC 22 and the demodulator 23 should just have a circuit configuration which is typically used in a well-known digital transmission system.

Figure 2:
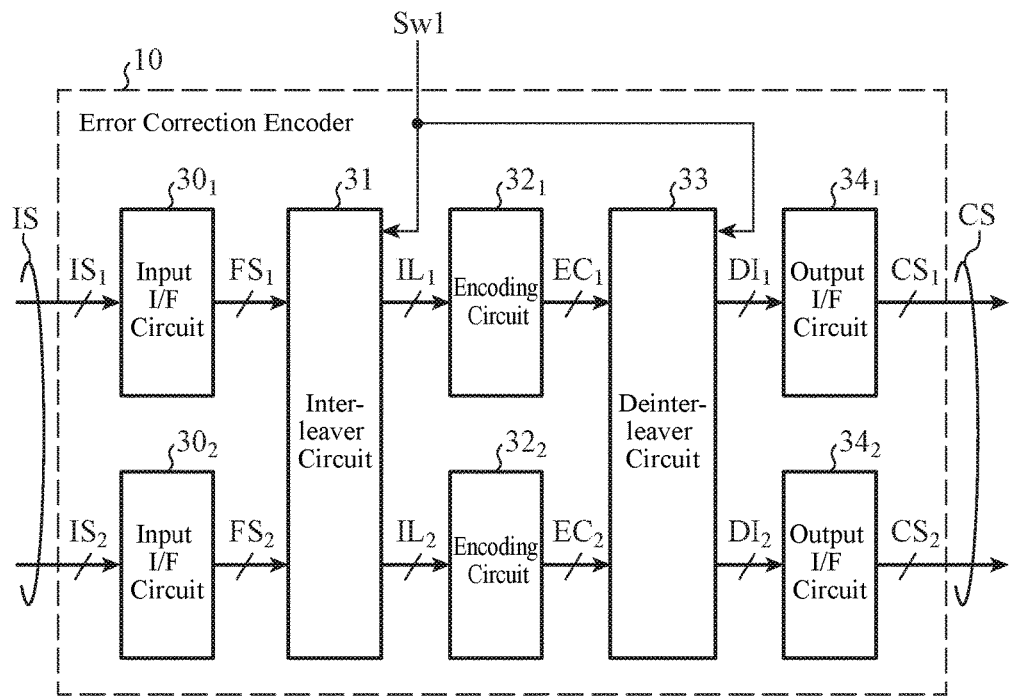
FIG. 2 is a functional block diagram showing the schematic configuration of an error correction encoder according to Embodiment 1.

FIG. 2 is a functional block diagram showing the schematic configuration of the error correction encoder 10. As shown in FIG. 2, the error correction encoder 10 includes input interface circuits (input I/F circuits) $30_1$ and $30_2$ having the same configuration, an interleaver circuit 31, encoding circuits $32_1$ and $32_2$ having the same configuration, a deinterleaver circuit 33, and output interface circuits (output I/F circuits) $34_1$ and $34_2$ having the same configuration.

In the example shown in FIG. 2, for the sake of expediency in explanation, a state in which the error correction encoder 10 is placed in the two-times speed mode in which two series of information sequences $IS_1$ and $IS_2$ are input in parallel to the error correction encoder 10 is shown. In the standard speed mode, while a single series of information sequences $IS_1$ is input to the error correction encoder 10, the other information sequence $IS_2$ is not input. Further, the interleaver circuit 31 is controlled so as to perform a first interleaving operation in the standard speed mode and perform a second interleaving operation in the two-times speed mode, in accordance with a switching control signal Sw1 furnished thereto from the transmission controller 14. The deinterleaver circuit 33 is also controlled so as to perform a first deinterleaving operation which is the inverse conversion corresponding to the first interleaving operation in the standard speed mode and perform a second deinterleaving operation which is the inverse conversion corresponding to the second interleaving operation in the two-times speed mode, in accordance with the switching control signal Sw1.

First, operations of the error correction encoder 10 in the standard speed mode will be explained. The input I/F circuit $30_1$ performs input interface processing such as an input timing adjusting operation, a demultiplexing operation and a descrambling operation, on information sequences $IS_1$ input thereto, thereby to form plural transmission frames compliant with a standard such as ITU-T Recommendation G.709. Bit sequences $FS_1$ of these transmission frames are outputted to the interleaver circuit 31. The format of the transmission frames will be mentioned below. In this embodiment, although the information sequences $IS_1$ are input to the input I/F circuit $30_1$ as a parallel signal defined by an interface standard such as SFI (Serdes Framer Interface), the information sequences $IS_1$ can be alternatively input to the input I/F circuit $30_1$ as a serial signal. Further, the bit sequences $FS_1$ is furnished to the interleaver circuit 31 as a parallel signal. The details of the above-mentioned input interface processing are not limited particularly.

Next, the interleaver circuit 31 performs a first interleaving operation to rearrange the order of the bit sequences $FS_1$ input thereto, and outputs a single series of plural yet-to-be-coded bit sequences $IL_1$ to the encoding circuit $32_1$. In this embodiment, the length (sequence length) of each yet-to-be-coded bit sequence $IL_1$ is a fixed bit length suited to a unit to be processed of the encoding circuit $32_1$. The details of the first interleaving operation will be mentioned below.

Figure 3:
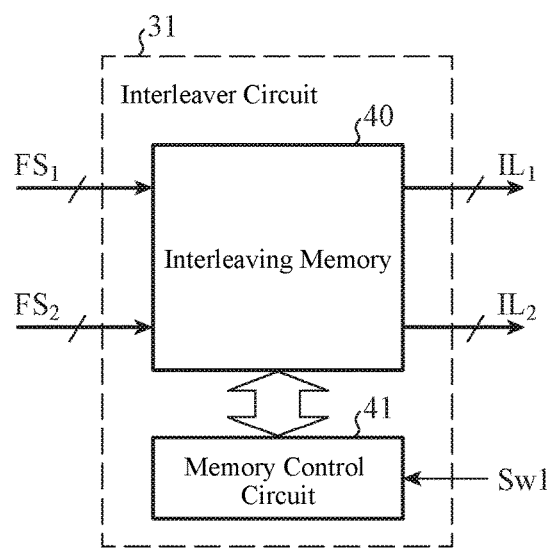
FIG. 3 is a functional block diagram showing the schematic configuration of an interleaver circuit in the error correction encoder according to Embodiment 1.

FIG. 3 is a block diagram schematically showing an example of the configuration of the interleaver circuit 31. The interleaver circuit 31 shown in FIG. 3 is comprised of an interleaving memory 40 including a buffer memory such as an SDRAM (Synchronous DRAM), and a memory control circuit 41 that controls a data writing operation and a data reading operation on this interleaving memory 40. The interleaving memory 40 has a capacity capable of storing a predetermined number of frames for bit sequences $FS_1$ and $FS_2$ input thereto. The memory control circuit 41 outputs a single series of yet-to-be-coded bit sequences $IL_1$ by selectively reading bits from the bit sequences stored in the interleaving memory 40 in the standard speed mode, and outputs two series of yet-to-be-coded bit sequences $IL_1$ and $IL_2$ by selectively reading bits from the bit sequences stored in the interleaving memory 40 in the two-times speed mode, in accordance with a switching control signal Sw1. Because the current operation mode is the standard speed mode, bit sequences $FS_2$ are not input to the interleaving memory 40, and yet-to-be-coded bit sequences $IL_2$ are not outputted from the interleaving memory 40.

Referring to FIG. 2, the encoding circuit $32_1$ applies error-correction coding to yet-to-be-coded bit sequences $IL_1$ input thereto, and outputs a single series of coded bit sequences $EC_1$ containing codeword bits. As an error-correction coding method, for example, a coding method using RS (Reed-Solomon) codes, BCH (Bose-Chaudhuri-Hocquenghem) codes, convolutional codes, convolutional turbo codes, block turbo codes (BTC) or LDPC (Low-Density Parity-Check) codes can be adopted. Concatenated codes or product codes can also be used. When error correction codes which make it possible to perform soft decision decoding having a high error correction ability are used, it is desirable to particularly use LDPC codes.

Next, the deinterleaver circuit 33 performs a first deinterleaving operation to change the order of coded bit sequences $EC_1$ input thereto from the encoding circuit $32_1$, to the original order existed prior to the first interleaving operation, and outputs a single series of coded bit sequences $DI_1$.

Figure 4:
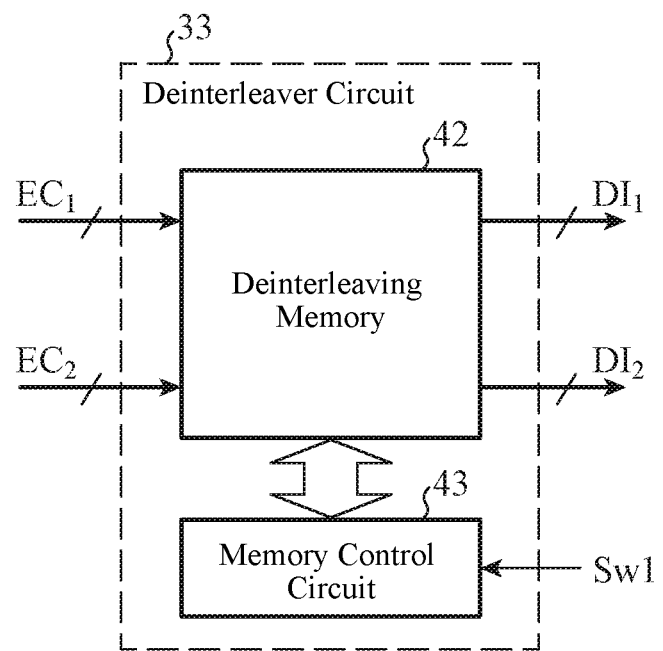
FIG. 4 is a functional block diagram showing the schematic configuration of a deinterleaver circuit in the error correction encoder according to Embodiment 1.

FIG. 4 is a block diagram schematically showing an example of the configuration of the deinterleaver circuit 33. The deinterleaver circuit 33 shown in FIG. 4 is comprised of a deinterleaving memory 42 including a buffer memory such as an SDRAM, and a memory control circuit 43 that controls a data writing operation and a data reading operation on this deinterleaving memory 42. The deinterleaving memory 42 has a capacity capable of storing a predetermined number of frames for coded bit sequences $EC_1$ and $EC_2$ input thereto. The memory control circuit 43 outputs a single series of coded bit sequences $DI_1$ by selectively reading bits from the bit sequences stored in the deinterleaving memory 42 in the standard speed mode, and outputs two series of coded bit sequences $DI_1$ and $DI_2$ by selectively reading bits from the bit sequences stored in the deinterleaving memory 42 in the two-times speed mode, in accordance with the switching control signal Sw1. Because the current operation mode is the standard speed mode, coded bit sequences $EC_2$ is not input to the deinterleaving memory 42, and the coded bit sequences $DI_2$ are not outputted from the deinterleaving memory 42.

Referring to FIG. 2, the output I/F circuit $34_1$ performs output interface processing such as a scrambling operation, a multiplexing operation and an output timing adjusting operation, on the coded bit sequences $DI_1$ input thereto, thereby to generate a single series of code sequences $CS_1$. The code sequences $CS_1$ are outputted to the signal processing circuit 11 for transmission as a coded signal CS. In this embodiment, although the code sequences $CS_1$ are outputted as a parallel signal compliant with an interface standard such as SFI, the code sequences $CS_1$ can be alternatively outputted as a serial signal. The details of the above-mentioned output interface processing are not limited particularly.

In the above-explained operation in the standard speed mode, input and output of signals to and from the input I/F circuit $30_2$, input and output of signals to and from the encoding circuit $32_2$, and input and output of signals to and from the output I/F circuit $34_2$ are not performed. Therefore, it is preferable to, in the standard speed mode, stop the operations of the input I/F circuit $30_2$, the encoding circuit $32_2$ and the output I/F circuit $34_2$ for reduction in the power consumption.

Next, operations of the error correction encoder 10 in the two-times speed mode will be explained. In the two-times speed mode, the input I/F circuit $30_2$, the encoding circuit $32_2$ and the output I/F circuit $34_2$ operate in the same way that the input I/F circuit $30_1$, the encoding circuit $32_1$ and the output I/F circuit $34_1$ operate, respectively.

The input I/F circuits $30_1$ and $30_2$ perform the input interface processing on two series of information sequences $IS_1$ and $IS_2$ input thereto in parallel, to form two series of transmission frames compliant with a standard such as ITU-T Recommendation G.709, respectively. Bit sequences $FS_1$ and $FS_2$ of these transmission frames are outputted to the interleaver circuit 31.

The interleaver circuit 31 performs the second interleaving operation to rearrange the orders of the bit sequences $FS_1$ and $FS_2$ input thereto in parallel, and outputs two series of yet-to-be-coded bit sequences $IL_1$ and $IL_2$ in parallel to the encoding circuits $32_1$ and $32_2$. The details of the second interleaving operation will be explained below.

Next, the encoding circuits $32_1$ and $32_2$ apply the error-correction coding to the two series of yet-to-be-coded bit sequences $IL_1$, $IL_2$ input thereto, and output two series of coded bit sequences $EC_1$ and $EC_2$ each containing codeword bits in parallel, respectively.

Next, the deinterleaver circuit 33 performs the second deinterleaving operation to change the orders of the two series of coded bit sequences $EC_1$ and $EC_2$ input thereto, to the original orders existed prior to the second interleaving operation, and outputs two series of coded bit sequences $DI_1$ and $DI_2$ in parallel to the output I/F circuits $34_1$ and $34_2$. Then, the output I/F circuits $34_1$ and $34_2$ perform the output interface processing on the coded bit sequences $DI_1$ and $DI_2$ input thereto, thereby to generate two series of code sequences $CS_1$ and $CS_2$, respectively. These code sequences $CS_1$ and $CS_2$ are outputted to the signal processing circuit 11 for transmission as coded signals CS.

In the two-times speed mode as explained above, because the error correction encoder 10 performs an operation to code two series of information sequences $IS_1$ and $IS_2$ in parallel, the error correction encoder 10 can perform the coding operation at a speed that is two times the speed at which the error correction encoder performs the coding operation in the standard speed mode. Hereafter, a series including the bit sequences $FS_1$, yet-to-be-coded bit sequences $IL_1$, the coded bit sequences $EC_1$ and $DI_1$ and the code sequences $CS_1$, which correspond to information sequences $IS_1$, is referred to as a "series A", and a series including the bit sequence $FS_2$, yet-to-be-coded bit sequences $IL_2$, the coded bit sequences $EC_2$ and $DI_2$ and the code sequences $CS_2$, which correspond to the other information sequences $IS_2$, is referred to as a "series B."

In the two-times speed mode, the interleaver circuit 31 can assign a part of the bits of the bit sequences $FS_1$ in the series A to the yet-to-be-coded bit sequences $IL_2$ in the series B by performing the second interleaving operation. In contrast, the interleaver circuit 31 can assign a part of the bits of the bit sequences $FS_2$ in the series B to the yet-to-be-coded bit sequences $IL_1$ in the series A. Thus, the bits of the bit sequences $FS_1$ in the series A do not necessarily need to have a one-to-one correspondence with the bits of the yet-to-be-coded bit sequences $IL_1$ obtained by interleaving. Similarly, the bits of the bit sequences $FS_2$ in the series B do not necessarily need to have a one-to-one correspondence with the bits of the yet-to-be-coded bit sequences $IL_2$ obtained by interleaving.

Further, the circuit elements $30_1$, $30_2$, 31, $32_1$, $32_2$, 33, $34_1$ and $34_2$ of the error correction encoder 10 can be configured so as to receive and transmit data by using pipelining. As an alternative, each of these circuit elements $30_1$, $30_2$, 31, $32_1$, $32_2$, 33, $34_1$ and $34_2$ can be configured so as to receive and transmit data by accessing a memory area for operation to which a circuit element at a preceding or next stage can refer. In addition, arbitrary circuit elements among these circuit elements $30_1$, $30_2$, 31, $32_1$, $32_2$, 33, $34_1$ and $34_2$ can be connected to each other in accordance with a predetermined interface standard such as SFI.

Next, an example of transmission frames generated by the input I/F circuits $30_1$ and $30_2$ will be explained.

Transmission frames according to this embodiment have a structure equivalent to that of OTUk frames compliant with ITU-T Recommendation G.709. FIGS. 5A and 5B are diagrams schematically showing the format of OTUk frames 5, and FIGS. 6A to 6C are diagrams showing an example of the structure of transmission frames #0, #1, #2 and #3 which are used in this embodiment.

As shown in FIG. 5A, each OTUk frame 5 has a frame size of 4-rows times Ca×16-columns, and each column contains 1 byte (8 bits) of information per one row. Further, each OTUk frame 5 is comprised of an OH (overhead) area 5a for accommodating control information, a payload area 5b for accommodating information sequences indicating a client signal, and a parity sequence area 5c for accommodating parity sequences of error correction codes. The total size of the OH area 5a and the payload area 5b is 4-rows times Ci×16-columns. In the case of Ca=255 and Ci=239, the size of each OTUk frame 5 is 4 rows times 4080 columns, and the total size of the OH area 5a and the payload area 5b is 4-rows times 3824-columns. As shown by arrows of FIG. 5B, the transmitting order of the bits of each OTUk frame 5 (i.e., the order of the bit sequences) is defined in such a way that the bits are transmitted in order along a column direction from a left end of the columns to a right end of the columns and along a row direction from an upper end of the rows to a lower end of the rows, and in order from the most significant bit (MSB) to the least significant bit (LSB). The column direction means the direction in which the columns are arranged, and the row direction means the direction in which the rows are arranged.

Figure 6A:
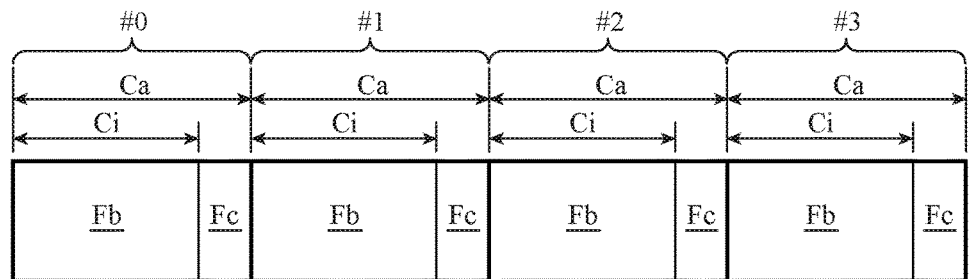
FIGS. 6A to 6C are diagrams showing an example of the structure of transmission frames according to Embodiment 1.
Figure 6B:
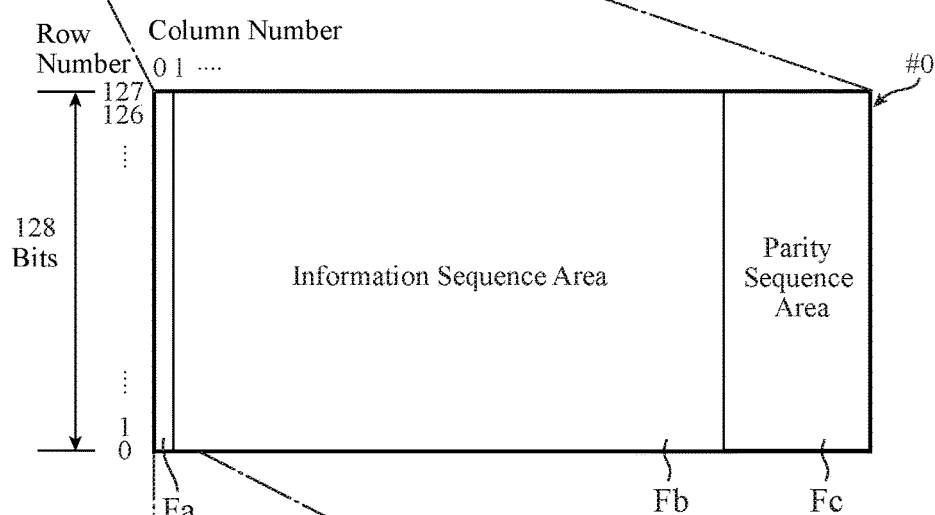

Four transmission frames #0 to #3 shown in FIG. 6A are equivalent to one OTUk frame 5. All of the four transmission frames #0 to #3 have the same frame structure. Each of the transmission frames has a size of 128-rows times Ca-columns, as shown in FIGS. 6A and 6B, and each column accommodates 1 bit of information per one row. The size n (=128) in the row direction of each of the transmission frames #0 to #3 structured in this way is called the "parallel number." Control information to be accommodated in the OH area 5a of each OTUk frame 5 is divided into four parts and these parts are accommodated separately in four OH areas Fa which include the zero-th columns of the transmission frames #0 to #3. An information signal to be accommodated in the payload area 5b of each OTUk frame 5 is divided into four parts and these parts are accommodated separately in four information sequence areas Fb which include the 1st through (Ci−1)-th columns of the transmission frames #0 to #3. Further, parity sequences to be accommodated in the parity sequence area 5c of each OTUk frame 5 is divided into four parts and these parts are accommodated separately in four parity sequence areas Fc which include the Ci-th through (Ca−1)-th columns of the transmission frames #0 to #3.

Figure 6C:
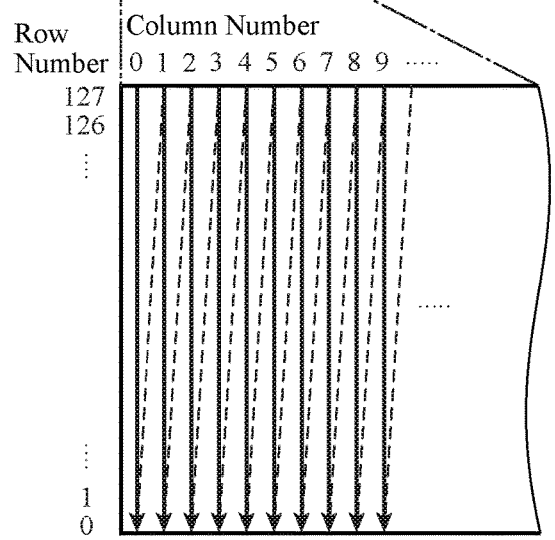

Further, as shown by arrows of FIG. 6C, the transmitting order of the bits of the transmission frames #0 to #3 is defined in such a way that the bits are transmitted in order of the transmission frames #0, #1, #2 and #3, and the bits in each of the areas of each of the transmission frames are transmitted in order along a row direction from an upper end of the area to a lower end of the area and along a column direction from a left end of the area to a right end of the area. This transmitting order of the bits corresponds to that of the bits of each OTUk frame 5.

In this regard, each of the transmission frames is divided into the OH area Fa, the information sequence area Fb and the parity sequence area Fc, as mentioned above. However, the present invention is not limited to this division. The division of each of the transmission frames can be any kind of division as long as the division conforms with the logical structure of OTUk frames 5. For example, transmission frames having a structure in which an OH area, an information sequence area, an OH area and a parity sequence area are arranged, like a striped pattern, in this order can be adopted. Further, this embodiment can be applied also to OTUkV frames each having a frame size to which that of each OTUk frame 5 is increased (Ca is increased to more than 255). The structure of OTUkV frames will be mentioned below.

Further, although the parallel number n of each of the transmission frames is 128 in the example shown in FIG. 6B, the parallel number n of each of the transmission frames can be set to any value as long as the parallel number n has a value which conforms with the logical structure of OTUk frames 5.

Figure 7:
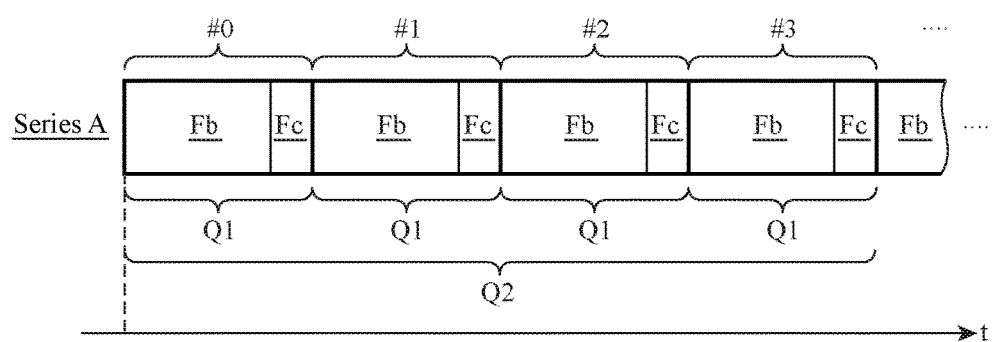
FIG. 7 is a diagram showing transmission frames which are transmitted in a standard speed mode.

Next, an example of the first interleaving operation in the standard speed mode will be explained. FIG. 7 is a diagram showing transmission frames #0, #1, #2, #3, . . . which are transmitted in the standard speed mode. In the example shown in FIG. 7, a situation in which the transmission frames #0, #1, #2, #3, . . . are transmitted continuously in this order is shown.

The interleaver circuit 31 can easily change the interleaving unit from one of a target unit Q1 including one transmission frame and a target unit Q2 including four transmission frames, to the other one. For example, the interleaver circuit 31 and the deinterleaver circuit 33 can be configured to change the interleaving and deinterleaving units in accordance with a switching control signal Sw1.

The interleaver circuit 31 in the standard speed mode selects plural columns that are arranged at an interval of C columns (where C is an integral multiple of 2) in the transmission frames #0, #1, . . . of the series A, for each interleaving unit, and generates yet-to-be-coded bit sequences $IL_1$ of the series A by sequentially selecting bits at an interval of R rows (where R is a positive integer) from each of the selected plural columns. Hereafter, an example of the first interleaving operation in the case of C=4 and R=8 will be explained with reference to FIG. 8. FIG. 8 is a diagram illustrating a state in which the bits of 32 yet-to-be-coded bit sequences #A0, #A1, . . . , and #A31 which construct the single series are assigned to the transmission frames that are temporarily stored in the interleaving memory 40. The single series of yet-to-be-coded bit sequences $IL_1$ includes these 32 yet-to-be-coded bit sequences #A0, #A1, and #A31. In the example shown in FIG. 8, a label "#Ax-bw" is attached to the position to which the w-th bit of the x-th yet-to-be-coded bit sequence #Ax (where x is an arbitrary integer ranging from 0 to 31) is assigned. Each of the positions to which the zero-th yet-to-be-coded bit sequence #A0 is assigned is highlighted by a black frame. In the interleaver circuit 31, the memory control circuit 41 performs the first interleaving operation by sequentially reading the yet-to-be-coded bit sequences #A0, #A1, and #A31 from the interleaving memory 40 in accordance with the assignment shown in FIG. 8.

As shown in FIG. 8, the zero-th bits #A0-b0, #A1-b0, . . . , and #A7-b0 of the zero-th through 7th yet-to-be-coded bit sequences #A0, #A1, . . . , and #A7 are assigned to the positions at the 127th through 120th rows of the zero-th column, the zero-th bits #A8-b0, #A9-b0, . . . , and #A15-b0 of the 8th through 15th yet-to-be-coded bit sequences #A8, #A9, . . . , and #A15 are assigned to the positions at the 127th through 120th rows of the 1st column, the zero-th bits #A16-b0, #A17-b0, . . . , and #A23-b0 of the 16th through 23rd yet-to-be-coded bit sequences #A16, #A17, . . . , and #A23 are assigned to the positions at the 127th through 120th rows of the 2nd column, and the zero-th bits #A24-b0, #A25-b0, . . . , and #A31-b0 of the 24th through 31st yet-to-be-coded bit sequences #A24, #A25, . . . , and #A31 are assigned to the positions at the 127th through 120th rows of the 3rd column.

Further, the 1st and subsequent bits of each of the yet-to-be-coded bit sequences are assigned to positions that are selected at an interval of R (=8) rows, starting from the row at the assigned position of the zero-th bit, in each of the columns arranged at an interval of C (=4) columns. For example, the bits of the zero-th through 7th yet-to-be-coded bit sequences #A0 to #A7 are assigned to the zero-th, 4th, 8th, . . . columns that are arranged at an interval of four columns in the transmission frames before interleaving, the bits of the 8th through 15th yet-to-be-coded bit sequences #A8 to #A15 are assigned to the 1st, 5th, 9th, . . . columns that are arranged at an interval of four columns, the bits of the 16th through 23rd yet-to-be-coded bit sequences #A16 to #A23 are assigned to the 2nd, 6th, 9th, . . . columns that are arranged at an interval of four columns, and the bits of the 24th through 31st yet-to-be-coded bit sequences #A24 to #A31 are assigned to the 3rd, 7th, 10th, . . . columns that are arranged at an interval of four columns.

The interleaver circuit 31 sequentially outputs the above-mentioned 32 yet-to-be-coded bit sequences #A0, #A1, . . . , and #A31 to the encoding circuit $32_1$. For example, the interleaver circuit 31 performs an operation to output the zero-th yet-to-be-coded bit sequences #A0-$b$0, #A0-$b$1, . . . , and #A0-$by$ (where y is a positive integer), then output the 1st yet-to-be-coded bit sequences #A1-$b$0, #A1-$b$1, . . . , and #A1-$by$, and further output the 2nd yet-to-be-coded bit sequences #A2-$b$0, #A2-$b$1, . . . , and #A2-$by$.

Next, an example of the second interleaving operation in the two-times speed mode will be explained. FIGS. 9A and 9B are diagrams showing transmission frames #0, #1, #2, #3, and . . . which are transmitted in the two-times speed mode. In an example shown in FIGS. 9A and 9B, the transmission frames #0, #1, #2, #3, . . . are transmitted while the transmission frames are divided into two series of transmission frames. By way of the series A, the transmission frames #0, #1, #0, #1, . . . shown in FIG. 9A are transmitted in this order, and, byway of the series B, the transmission frames #2, #3, #2, #3, . . . shown in FIG. 9B are transmitted in this order.

For the series A, the interleaver circuit 31 can easily change the interleaving unit from one of a target unit S1 including one transmission frame and a target unit S2 including two transmission frames, to the other one. Also for the series B, the interleaver circuit 31 can easily change the interleaving unit from one of a target unit R1 including one transmission frame and a target unit R2 including two transmission frames, to the other one. For example, the interleaver circuit 31 and the deinterleaver circuit 33 can be configured to change the interleaving and deinterleaving units in accordance with a switching control signal Sw1.

The interleaver circuit 31 in the two-times speed mode selects plural columns that are arranged at an interval of C/2 columns in each of the transmission frames #0, #1, . . . of the series A, for each interleaving unit, and generates yet-to-be-coded bit sequences $IL_1$ by sequentially selecting bits at an interval of R rows (where R is a positive integer) from each of the selected plural columns. The interleaver circuit 31 also selects plural columns that are arranged at an interval of C/2 columns in each of the transmission frames #2, #3, . . . of the series B, for each interleaving unit, and generates yet-to-be-coded bit sequences $IL_2$ by sequentially selecting bits at an interval of R rows (where R is a positive integer) from each of the selected plural columns.

FIG. 10 is a diagram illustrating a state in which the bits of 16 yet-to-be-coded bit sequences #A0, #A1, . . . , and #A15 which construct the series A are assigned to the transmission frames before interleaving, and FIG. 11 is a diagram illustrating a state in which the bits of 16 yet-to-be-coded bit sequences #B0, #B1, . . . , and #B15 which construct the series B are assigned to the transmission frames before interleaving. In the example shown in FIG. 10, a label "#A$x$-$bw$" is attached to the position to which the w-th bit of the x-th yet-to-be-coded bit sequence #A$x$ (where x is an arbitrary integer ranging from 0 to 15) is assigned. Each of the positions to which the zero-th yet-to-be-coded bit sequence #A0 is assigned is highlighted by a black frame. Similarly, in the example shown in FIG. 11, a label "#B$z$-$bv$" is attached to the position to which the v-th bit of the z-th yet-to-be-coded bit sequence #B$z$ (where z is an arbitrary integer ranging from 0 to 15) is assigned. Each of the positions to which the zero-th yet-to-be-coded bit sequence #B0 is assigned is highlighted by a black frame.

For the series A, as shown in FIG. 10, the zero-th bits #A0-$b$0, #A1-$b$0, . . . , and #A7-$b$0 of the zero-th through 7th yet-to-be-coded bit sequences #A0, #A1, . . . , and #A7 are assigned to the positions at the 127th through 120th rows of the zero-th column, and the zero-th bits #A8-$b$0, #A9-$b$0, . . . , and #A15-$b$0 of the 8th through 15th yet-to-be-coded bit sequences #A8, #A9, . . . , and #A15 are assigned to the positions at the 127th through 120th rows of the 1st column. Further, the 1st and subsequent bits of respective yet-to-be-coded bit sequences are assigned to positions that are selected at an interval of R (=8) rows in each of the columns that are arranged at an interval of C (=2) columns, starting from the assigned position of the zero-th bit. For example, the bits of the zero-th through 7th yet-to-be-coded bit sequences #A0 to #A7 are assigned to the zero-th, 2nd, 4th, . . . columns that are arranged at an interval of two columns in the transmission frames before interleaving, and the bits of the 8th through 15th yet-to-be-coded bit sequences #A8 to #A15 are assigned to the 1st, 3rd, 5th, . . . columns that are arranged at an interval of two columns. Further, as shown in FIG. 10, the x-th yet-to-be-coded bit sequence #A$x$ includes the bits that are selected at an interval of 8 rows in each of the columns to which the x-th yet-to-be-coded bit sequence #A$x$ is assigned. The interval length of 8 rows for bit selection in each column is the same as the above-mentioned interval length for bit selection in each column in the standard speed mode. Such assignments of bits are repeatedly performed within either each interleaving unit S2 of two frames or each interleaving unit S1 of one frame.

On the other hand, for the series B, as shown in FIG. 11, the zero-th bits #B0-$b$0, #B1-$b$0, . . . , and #B7-$b$0 of the zero-th through 7th yet-to-be-coded bit sequences #B0, #B1, . . . , and #B7 are assigned to the positions at the 127th through 120th rows of the zero-th column, and the zero-th bits #B8-$b$0, #B9-$b$0, . . . , and #B15-$b$0 of the 8th through 15th yet-to-be-coded bit sequences #B8, #B9, . . . , and #B15 are assigned to the positions at the 127th through 120th rows of the 1st column. Further, the 1st and subsequent bits of respective yet-to-be-coded bit sequences are assigned to positions that are selected at an interval of R (=8) rows in each of the columns that are arranged at an interval of C (=2) columns, starting from the assigned position of the zero-th bit. For example, the bits of the zero-th through 7th yet-to-be-coded bit sequences #B0 to #B7 are assigned to the zero-th, 2nd, 4th, . . . columns that are arranged at an interval of two columns in the transmission frames before interleaving, and the bits of the 8th through 15th yet-to-be-coded bit sequences #B8 to #B15 are assigned to the 1st, 3rd, 5th, . . . columns that are arranged at an interval of two columns. Further, as shown in FIG. 11, the z-th yet-to-be-coded bit sequence #Bz includes the bits that are selected at an interval of 8 rows in each of the columns to which the z-th yet-to-be-coded bit sequence #Bz is assigned. The interval length of 8 rows for bit selection in each column is the same as the above-mentioned interval length for bit selection in each column in the standard speed mode. Such assignments of bits are repeatedly performed within either each interleaving unit R2 of two frames or each interleaving unit R1 of one frame.

The interleaver circuit 31 sequentially outputs the above-mentioned 16 yet-to-be-coded bit sequences #A0, #A1, . . . , and #A31 and the above-mentioned 16 yet-to-be-coded bit sequences #B0, #B1, . . . , and #B31 in parallel to the encoding circuit $32_1$.

As explained above, the interleaver circuit 31 in the standard speed mode generates a single series of yet-to-be-coded bit sequences on the basis of the bits in plural columns that are arranged at an interval of C columns in transmission frames in the series A. On the other hand, the interleaver circuit 31 in the two-times speed mode generates yet-to-be-coded bit sequences in the series A and B on the basis of the bits in plural columns that are arranged at an interval of the shortened length which is one-half of C columns, i.e., at an interval of C/2 columns in transmission frames in the series A and B. Further, the total number (=32) of yet-to-be-coded bit sequences generated in the standard speed mode is equal to the total number (=16+16) of yet-to-be-coded bit sequences generated in the two-times speed mode. The interleaving as above is performed by using the interleaving memory 40 and the memory control circuit 41 which are shown in FIG. 3, and these interleaving memory 40 and memory control circuit 41 are used in common for the series A and B. As a result, the storage capacity of the whole memory required for the interleaving can be made relatively small. In the above-mentioned example, a maximum number of frames of each interleaving unit in the standard speed mode is four (FIG. 7), while each interleaving unit in the two-times speed mode has also a maximum of four frames (FIGS. 9A and 9B).

Although in the examples shown in FIGS. 8, 10 and 11, the number of rows of each interleaving unit, i.e., the parallel number n is 128, the present invention is not limited to the example in which the parallel number n is 128. For example, the error correction encoder 10 and the error correction decoder 20 can be configured so as to perform interleaving and deinterleaving also when the parallel number n is 512. Hereafter, an example of the interleaving operation in the case in which the parallel number n is 512 will be explained.

Figure 12:
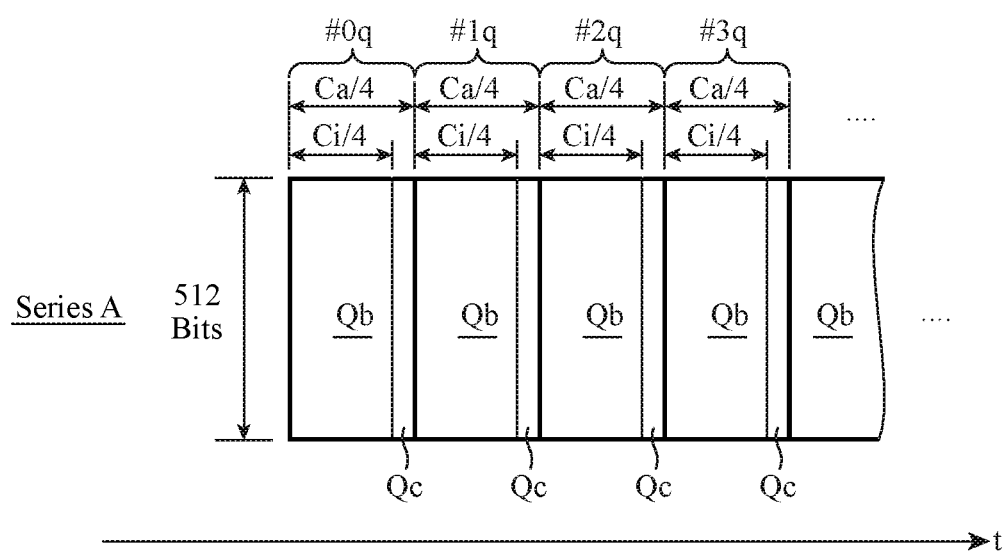
FIG. 12 is a diagram showing transmission frames having a parallel number of 512 which are transmitted in the standard speed mode.
Figure 13A:
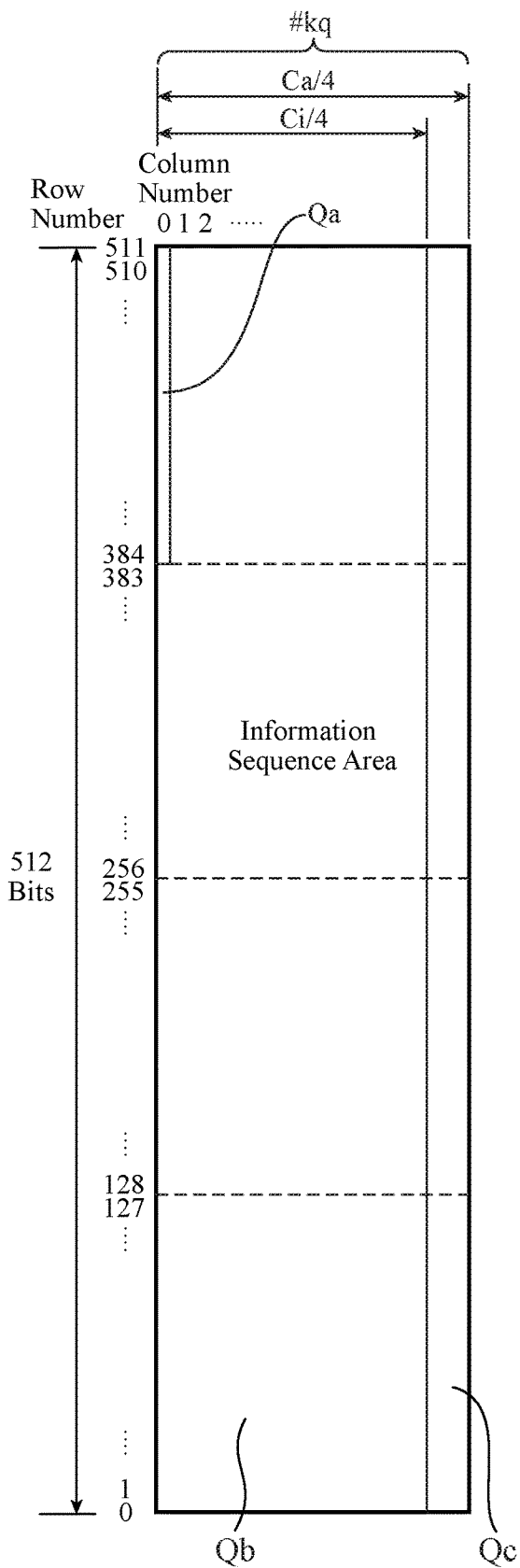
FIGS. 13A and 13B are diagrams showing an example of the structure of transmission frames having a parallel number of 512.
Figure 13B:
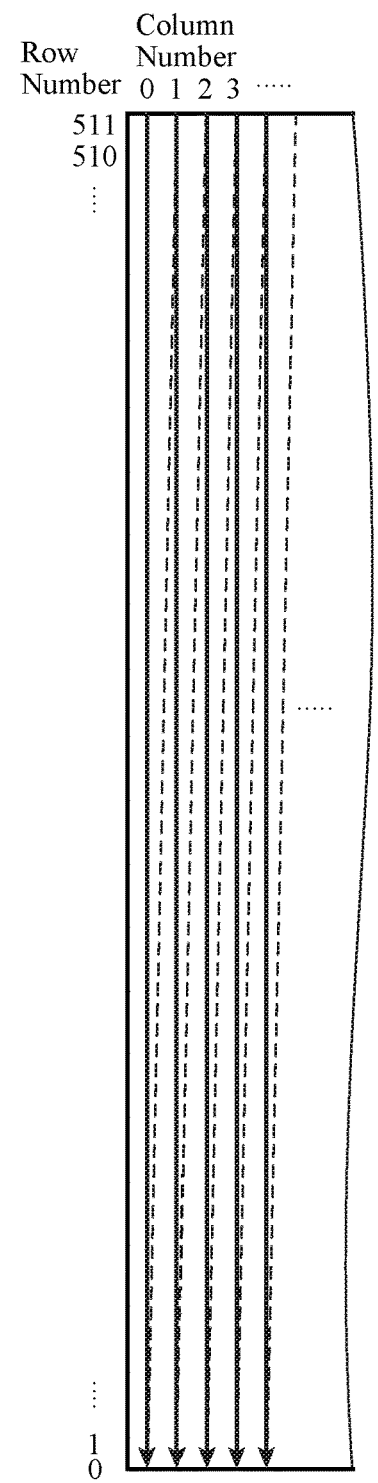

FIG. 12 is a diagram showing a situation in which transmission frames #0q, #1q, #2q, #3q, #0q, #1q, . . . which construct the series A and which have a parallel number of 512 are transmitted in the standard speed mode. Four transmission frames #0q, #1q, #2q and #3q are equivalent to one OTUk frame shown in FIG. 5A. FIGS. 13A and 13B are diagrams showing an example of the structure of each transmission frame #kq (where k is an arbitrary integer ranging from 1 to 4). As shown in the FIG. 13A, each transmission frame #kq has a size of 512-rows times Ca/4-columns, and each column accommodates one bit of information per one row. Control information to be accommodated in an OH area 5a of each OTUk frame 5 is divided into parts and these parts are accommodated separately in areas Qa which include the 384th through 511th rows of the zero-th columns of the transmission frames #0q to #3q.

Further, an information signal to be accommodated in a payload area 5b of each OTUk frame 5 is divided into parts and these parts are accommodated separately in information sequence areas Qb of the transmission frames #0q to #3q, and parity sequences to be accommodated in a parity sequence area 5c of each OTUk frame 5 is divided into parts and these parts are accommodated separately in parity sequence areas Qc of the transmission frames #0q to #3q. As shown by arrows of FIG. 13C, the transmitting order of the bits of each transmission frame is defined in such a way that the bits are transmitted in order along a row direction from an upper end of the rows to a lower end of the rows and along a column direction from a left end of the columns to a right end of the columns, like in the case shown in FIG. 6C.

FIG. 14 is a diagram illustrating a state in which the bits of 128 yet-to-be-coded bit sequences #A0, #A1, . . . , and #A127 which construct the series A are assigned to the transmission frames #0q, #1q, #2q, #3q, . . . temporarily stored in the interleaving memory 40. Each interleaving unit is set to have a size of either one transmission frame or four transmission frames. Further, each interleaving unit is divided into four areas each having 128 rows, and the assignment of bits of yet-to-be-coded bit sequences is performed for each of the division areas. More specifically, 32 yet-to-be-coded bit sequences #A0, #A1, . . . , and #A31 are assigned to a first division area which includes the 511th through 384th rows, 32 yet-to-be-coded bit sequences #A32, #A33, . . . , and #A63 are assigned to a second division area which includes the 383th through 256th rows, 32 yet-to-be-coded bit sequences #A64, #A65, . . . , and #A95 are assigned to a third division area which includes the 255th through 128th rows, and 32 yet-to-be-coded bit sequences #A96, #A97, . . . , and #A127 are assigned to a fourth division area which includes the 127th through zero-th rows. In the example shown in FIG. 14, each of the positions to which the yet-to-be-coded bit sequences #A0, #A32, #A64 and #A96 are assigned is particularly highlighted by a black frame. As shown in FIG. 14, a method of assigning bits to each of the division areas is the same as the assigning method shown in FIG. 8.

Figure 15A:
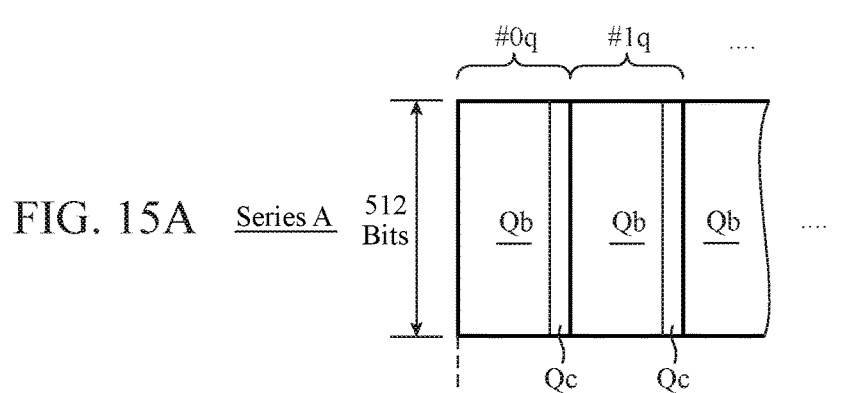
FIGS. 15A and 15B are diagrams showing transmission frames having a parallel number of 512 which are transmitted in the two-times speed mode.
Figure 15B:
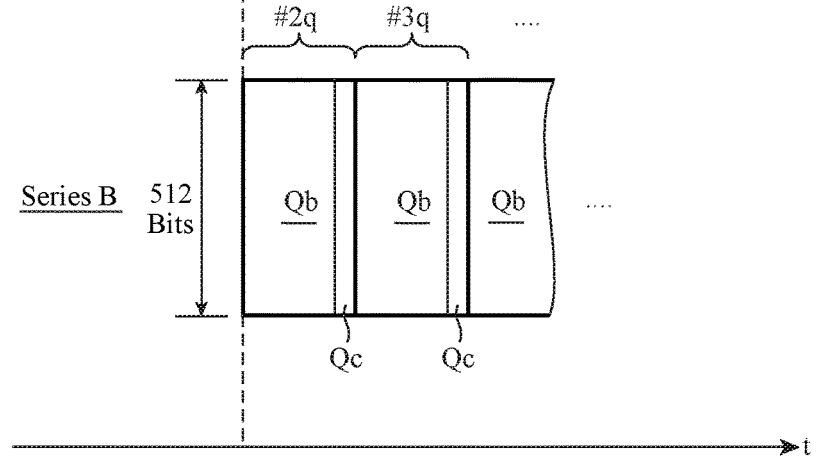

Next, FIG. 15A is a diagram showing a situation in which transmission frames #0q, #1q, #0q, and . . . which construct the series A and which have a parallel number of 512 are transmitted in the two-times speed mode, and FIG. 15B is a diagram showing a situation in which transmission frames #2q, #3q, #2q, . . . which construct the series B and which have a parallel number of 512 are transmitted in the two-times speed mode. FIG. 16 is a diagram illustrating a state in which the bits of 64 yet-to-be-coded bit sequences #A0, #A1, . . . , and #A63 which construct the series A are assigned to the transmission frames #0q, #1q, #0q, . . . temporarily stored in the interleaving memory 40. Each interleaving unit is set to have a size of either one transmission frame or two transmission frames. Further, each interleaving unit in the two-times speed mode is divided into four areas each having 128 rows, and the assignment of bits of yet-to-be-coded bit sequences is performed for each of the division areas, like in the case of the standard speed mode. As shown in FIG. 16, a method of assigning bits to each of the division areas is the same as the assigning method shown in FIG. 10.

On the other hand, FIG. 17 is a diagram illustrating a state in which the bits of 64 yet-to-be-coded bit sequences #B0, #B1, . . . , and #B63 which construct the series B are assigned to the transmission frames #2q, #3q, #2q, . . . temporarily stored in the interleaving memory 40. Each interleaving unit is set to have a size of either one transmission frame or two transmission frames. Further, each interleaving unit in the two-times speed mode is divided into four areas each having 128 rows, and the assignment of bits of yet-to-be-coded bit sequences is performed for each of the division areas, like in the case of the standard speed mode. As shown in FIG. 17, a method of assigning bits to each of the division area is the same as the assigning method shown in FIG. 11.

As explained above, also in the case in which the parallel number is 512, in the standard speed mode, a single series of yet-to-be-coded bit sequences is generated on the basis of the bits of plural columns that are arranged at an interval of C columns in transmission frames in the series A. In contrast, in the two-times speed mode, yet-to-be-coded bit sequences in the series A and B are generated on the basis of the bits of plural columns that are arranged at an interval of the shortened length which is one-half of C columns, i.e., at an interval of C/2 columns in transmission frames in each of the series A and B. Further, the total number (=128) of yet-to-be-coded bit sequences generated in the standard speed mode is equal to the total number (=64+64) of yet-to-be-coded bit sequences generated in the two-times speed mode. Because the interleaving memory 40 and the memory control circuit 41 which are shown in FIG. 3 are used in common for the series A and B, the storage capacity of the whole memory required for the interleaving can be made relatively small.

Next, the error correction decoder 20 shown in FIG. 1 will be explained in detail.

Figure 18:
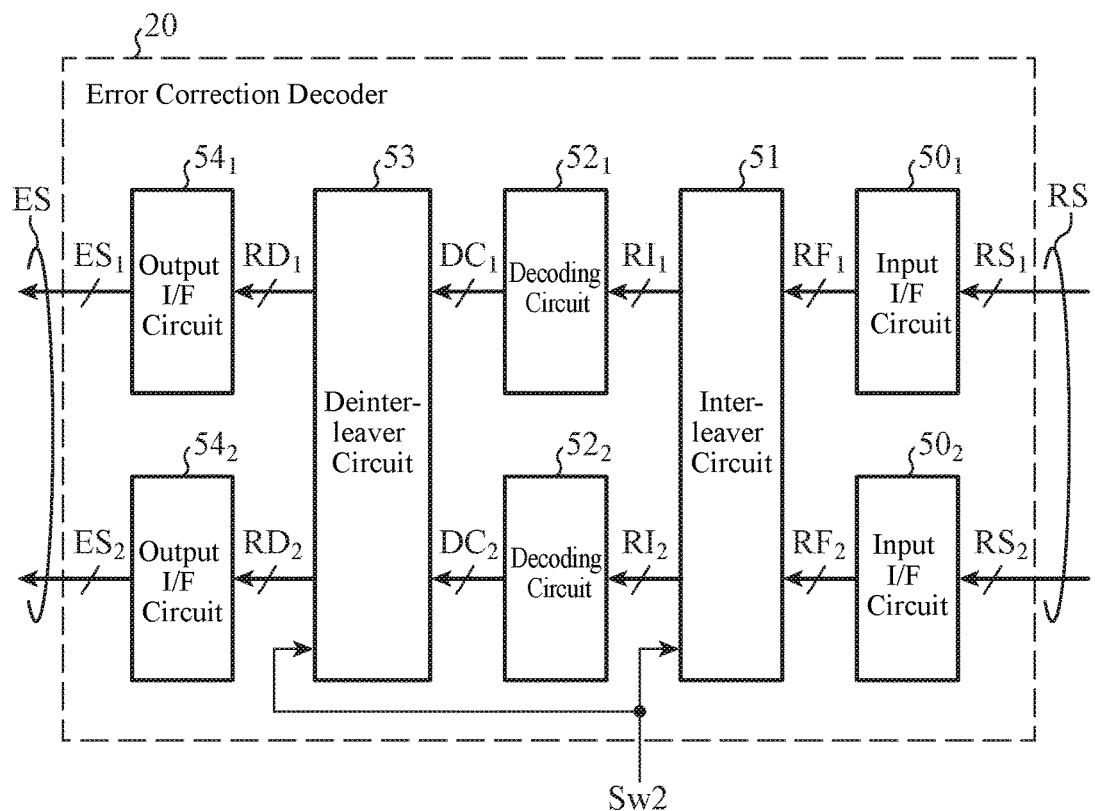
FIG. 18 is a functional block diagram showing the schematic configuration of an error correction decoder according to Embodiment 1.

FIG. 18 is a functional block diagram showing the schematic configuration of the error correction decoder 20 according to Embodiment 1. As shown in FIG. 18, the error correction decoder 20 includes input interface circuits (input I/F circuits) $50_1$ and $50_2$ having the same configuration, an interleaver circuit 51, decoding circuits $52_1$ and $52_2$ having the same configuration, a deinterleaver circuit 53, and output interface circuits (output I/F circuits) $54_1$ and $54_2$ having the same configuration.

In FIG. 18, for the sake of expediency in explanation, a state in the two-times speed mode in which two series of received sequences $RS_1$ and $RS_2$ are input in parallel to the error correction decoder 20 is shown. While one series of received sequences $RS_1$ is input to the error correction decoder 20 in the standard speed mode, the other series of received sequences $RS_2$ is not input to the error correction decoder 20. Further, the interleaver circuit 51 is controlled so as to perform a first interleaving operation in the standard speed mode and perform a second interleaving operation in the two-times speed mode, in accordance with a switching control signal Sw2 furnished thereto from the reception controller 24. This first interleaving operation and this second interleaving operation are substantially the same as the first interleaving operation and the second interleaving operation which are performed by the error correction encoder 10 in the transmission apparatus Tx. The deinterleaver circuit 53 is also controlled so as to perform a first deinterleaving operation which is the inverse conversion corresponding to the first interleaving operation in the standard speed mode and perform a second deinterleaving operation which is the inverse conversion corresponding to the second interleaving operation in the two-times speed mode, in accordance with the switching control signal Sw2.

First, operations of the error correction decoder 20 in the standard speed mode will be explained. The input I/F circuit $50_1$ performs input interface processing such as an input timing adjusting operation, a demultiplexing operation, a descrambling operation and a soft-input calculation, on the received sequences $RS_1$ input thereto, thereby to form reception frames corresponding to the above-mentioned transmission frames in the series A. Received value sequences $RF_1$ of these reception frames are outputted to the interleaver circuit 51. In this embodiment, although the received sequences $RF_1$ are input to the input I/F circuit $50_1$ as a parallel signal defined in an interface standard such as SFI, the received sequences $RF_1$ can be alternatively input to the input I/F circuit $50_1$ as a serial signal. The details of the above-mentioned input interface processing are not limited particularly.

In a case in which quantized received sequences processed by the ADC 22 and the signal processing circuit 21 for reception, as shown in FIG. 1, are quantized to have q bits per one symbol for transmission, hard decision decoding is performed when q=1 while soft decision decoding is performed when q>1. This embodiment can support both the hard decision decoding and the soft decision decoding. In the case of the soft decision decoding, the interleaving and the arithmetic processing performed by the error correction decoder 20 are fundamentally handled as single processing for each set of q bits which is a quantized unit. Further, in the soft-input calculation, the quantized received sequences having q bits per one symbol for transmission are converted into soft-input sequences having Q bits per one symbol for transmission. This conversion is an operation required when codes suitable for the soft decision decoding, for example, convolutional codes, convolutional turbo codes, block turbo codes or LDPC codes are selected. This operation is unnecessary when the hard decision decoding is performed. Further, in a case in which the quantized received sequences having q bits per one symbol for transmission can be processed as a soft input sequence, that operation is similarly unnecessary.

Figure 19:
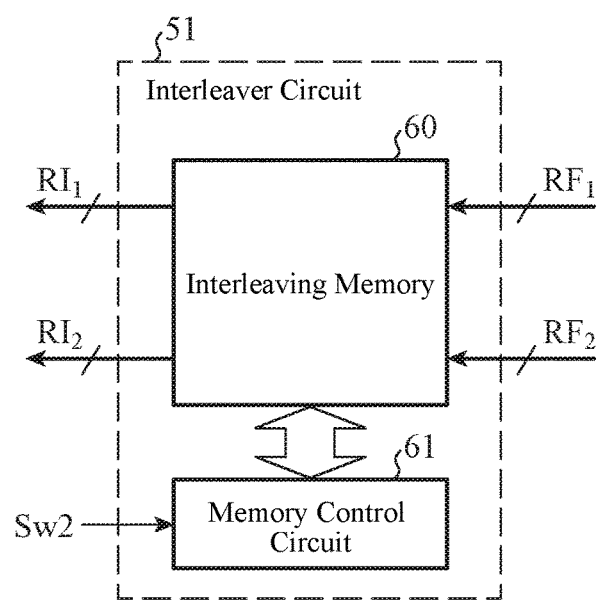
FIG. 19 is a functional block diagram showing the schematic configuration of an interleaver circuit in the error correction decoder according to Embodiment 1.

Referring to FIG. 18, the interleaver circuit 51 performs a first interleaving operation to rearrange the order of the received value sequences $RF_1$ input thereto, and outputs a single series of received value sequences $RI_1$ to the decoding circuit $52_1$. FIG. 19 is a block diagram schematically showing an example of the configuration of the interleaver circuit 51. The interleaver circuit 51 shown in FIG. 19 is comprised of an interleaving memory 60 including a buffer memory such as an SDRAM, and a memory control circuit 61 that controls a data writing operation and a data reading operation on this interleaving memory 60. The interleaving memory 60 has a capacity capable of storing a predetermined number of frames for received value sequences $RF_1$ and $RF_2$ input thereto. The memory control circuit 61 outputs a single series of received value sequences $RI_1$ by selectively reading received values from the received value sequences stored in the interleaving memory 60 in the standard speed mode, and outputs two series of received value sequences $RI_1$ and $RI_2$ by selectively reading received values from the received value sequences stored in the interleaving memory 60 in the two-times speed mode, in accordance with a switching control signal Sw2. Because the current operation mode is the standard speed mode, received value sequences $RF_2$ are not input to the interleaving memory 60, and received value sequences $RI_2$ are not outputted from the interleaving memory 60.

Referring to FIG. 18, the decoding circuit $52_1$ performs error-correction decoding on the series of received value sequences $RI_1$ input thereto, and outputs a single series of estimated bit sequences $DC_1$ containing estimated word bits.

Figure 20:
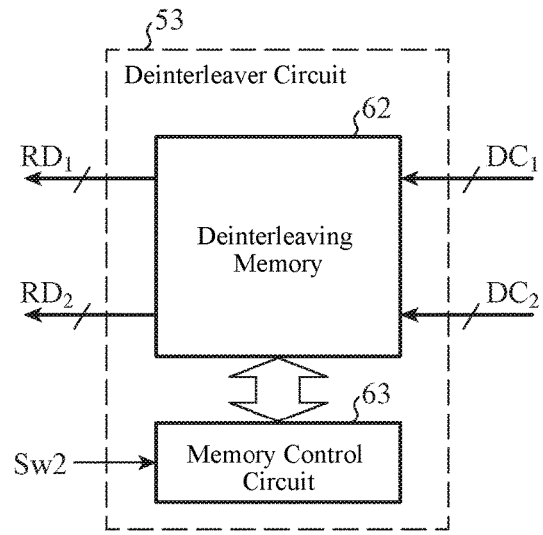
FIG. 20 is a functional block diagram showing the schematic configuration of the interleaver circuit in the error correction decoder according to Embodiment 1.

Next, the deinterleaver circuit 53 performs a first deinterleaving operation to change the order of estimated bit sequences $DC_1$ input thereto from the decoding circuit $52_1$, to the original order existed prior to the first interleaving operation, and outputs a single series of estimated bit sequences $RD_1$. FIG. 20 is a block diagram schematically showing an example of the configuration of the deinterleaver circuit 53. The deinterleaver circuit 53 shown in FIG. 20 is comprised of a deinterleaving memory 62 including a buffer memory such as an SDRAM, and a memory control circuit 63 that controls a data writing operation and a data reading operation on this deinterleaving memory 62. The deinterleaving memory 62 has a capacity capable of storing a predetermined number of frames for estimated bit sequences $DC_1$ and $DC_2$ input thereto. The memory control circuit 63 outputs a single series of estimated bit sequences $RD_1$ by selectively reading bits from the estimated bit sequences stored in the deinterleaving memory 62 in the standard speed mode, and outputs two series of estimated bit sequences $RD_1$ and $RD_2$ by selectively reading bits from the estimated bit sequences stored in the interleaving memory 62 in the two-times speed mode, in accordance with the switching control signal Sw2. Because the current operation mode is the standard speed mode, estimated bit sequences $DC_2$ are not input to the deinterleaving memory 62, and estimated bit sequences $RD_2$ are not outputted from the deinterleaving memory 62.

Referring to FIG. 12, the output I/F circuit $54_1$ performs output interface processing such as a scrambling operation, a multiplexing operation and an output timing adjusting operation, on the estimated bit sequences $RD_1$ input thereto, thereby to generate a single series of estimated information sequences $ES_1$. This estimated information sequences $ES_1$ are outputted to the receiver 3 as an estimated information signal ES. In this embodiment, although the estimated information sequences $ES_1$ are outputted as a parallel signal compliant with an interface standard such as SFI, the estimated information sequences $ES_1$ can be alternatively outputted as a serial signal. The details of the above-mentioned output interface processing are not limited particularly.

In the above-explained operation in the standard speed mode, input and output of signals to and from the input I/F circuit $50_2$, input and output of signals to and from the decoding circuit $52_2$, and input and output of signals to and from the output I/F circuit $54_2$ are not performed. Therefore, it is preferable to, in the standard speed mode, stop the operations of the input I/F circuit $50_2$, the decoding circuit $52_2$ and the output I/F circuit $54_2$ for reduction in the power consumption.

Next, operations of the error correction decoder 20 in the two-times speed mode will be explained. In the two-times speed mode, the input I/F circuit $50_2$, the decoding circuit $52_2$ and the output I/F circuit $54_2$ operate in the same way that the input I/F circuit $50_1$, the decoding circuit $52_1$ and the output I/F circuit $54_1$ operate, respectively.

The input I/F circuit $50_1$ performs the input interface processing on the received sequences $RS_1$ thereby to output reception frames, and forms the reception frames corresponding to the above-mentioned transmission frames in the series A. The input I/F circuit $50_2$ performs the input interface processing on the received sequences $RS_2$ thereby to output reception frames, and forms the reception frames corresponding to the above-mentioned transmission frames in the series B. Received value sequences $RF_1$ and $RF_2$ of these reception frames are outputted to the interleaver circuit 51.

The interleaver circuit 51 performs the second interleaving operation to rearrange the orders of the received value sequences $RF_1$ and $RF_1$ input thereto in parallel, and outputs two series of received value sequences $RI_1$ and $RI_2$ in parallel to the decoding circuits $52_1$ and $52_2$.

Next, the encoding circuits $52_1$ and $52_2$ perform the error-correction decoding on the two series of received value sequences $RI_1$, $RI_2$ input thereto, and output two series of estimated bit sequences $DC_1$ and $DC_2$ each containing estimated word bits in parallel, respectively.

Next, the deinterleaver circuit 53 performs the second deinterleaving operation to change the orders of two series of estimated bit sequences $DC_1$ and $DC_2$ input thereto, to the original order existed prior to the second interleaving operation, and outputs two series of estimated bit sequences $RD_1$ and $RD_2$ in parallel to the output I/F circuits $54_1$ and $54_2$. Then, the output I/F circuits $54_1$ and $54_2$ perform the output interface processing on the estimated bit sequences $RD_1$ and $RD_2$ input thereto, thereby to generate two series of estimated information sequences $ES_1$ and $ES_2$, respectively. These estimated information sequences $ES_1$ and $ES_2$ are outputted to the receiver 3 as estimated information signals ES.

Further, the circuit elements $50_1$, $50_2$, 51, $52_1$, $52_2$, 53, $54_1$ and $54_2$ of the error correction decoder 20 can be configured so as to receive and transmit data by using pipelining. As an alternative, each of these circuit elements $50_1$, $50_2$, 51, $52_1$, $52_2$, 53, $54_1$ and $54_2$ can be configured so as to receive and transmit data by accessing a memory area for operation to which a circuit element at a preceding or next stage can refer. In addition, arbitrary circuit elements among these circuit elements $50_1$, $50_2$, 51, $52_1$, $52_2$, 53, $54_1$ and $54_2$ can be connected to each other in accordance with a predetermined interface standard such as SFI.

As described above, according to Embodiment 1, the interleaver circuit 31 and deinterleaver circuit 33 of the error correction encoder 10 can be used in common for both the standard speed mode and the two-times speed mode without providing two parallel-operating elements for every of the circuits in the error correction encoder 10. Therefore, it is possible to provide the error correction encoder 10 and the transmission apparatus Tx which are enabled to change their execution speeds while avoiding an increase in their circuit scales. Further, also in the error correction decoder 20 corresponding to this error correction encoder 10, the interleaver circuit 51 and deinterleaver circuit 53 of the error correction decoder 20 can be used in common for both the standard speed mode and the two-times speed mode without providing two parallel-operating elements for every of the circuits in the error correction decoder. Therefore, it is possible to provide the error correction decoder 20 and the reception apparatus Rx which are enabled to change their execution speeds while avoiding an increase in their circuit scales.

Embodiment 2

Figure 21:
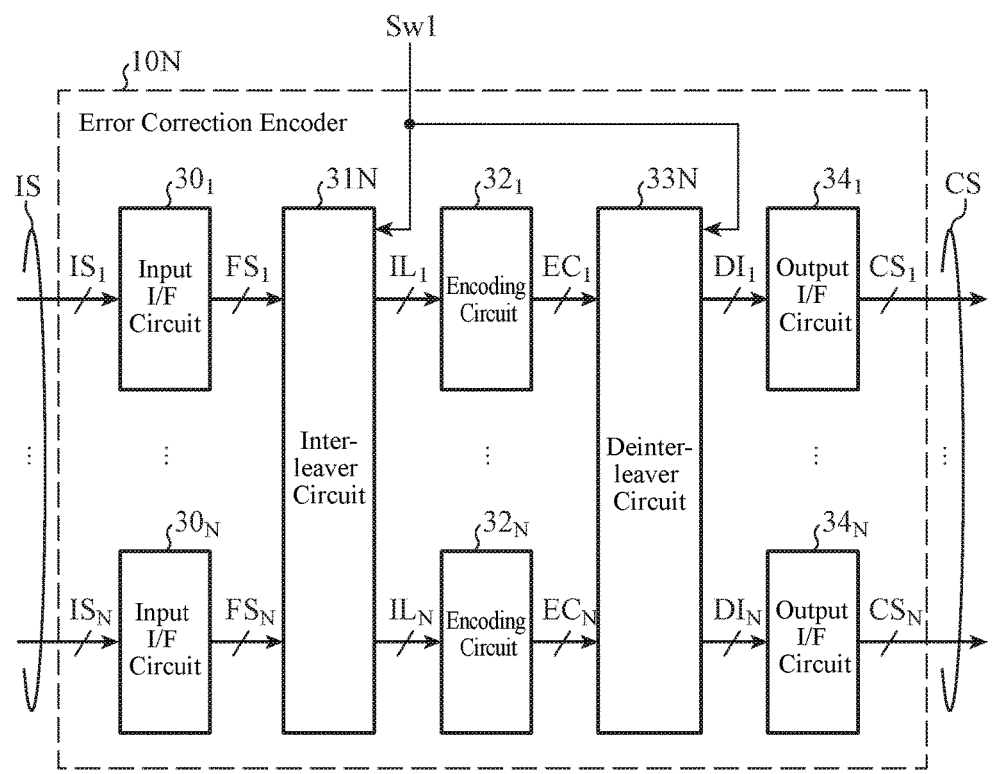
FIG. 21 is a functional block diagram showing the schematic configuration of an error correction encoder according to Embodiment 2 of the present invention.

FIG. 21 is a functional block diagram showing the schematic configuration of an error correction encoder 10N according to Embodiment 2 of the present invention. The configuration of a transmission apparatus according to this embodiment is the same as that of the transmission apparatus Tx according to Embodiment 1 with the exception that an error correction encoder 10N shown in FIG. 21 is disposed instead of the error correction encoder 10 shown in FIG. 1.

As shown in FIG. 21, the error correction encoder 10N includes input interface circuits (input I/F circuits) $30_1$, . . . , and $30_N$ having the same configuration, an interleaver circuit 31N, encoding circuits $32_1$, . . . , and $32_N$ having the same configuration, a deinterleaver circuit 33N and output interface circuits (output I/F circuits) $34_1, \ldots,$ and $34_N$ having the same configuration, where N is an integer larger than or equal to 3.

Figure 22:
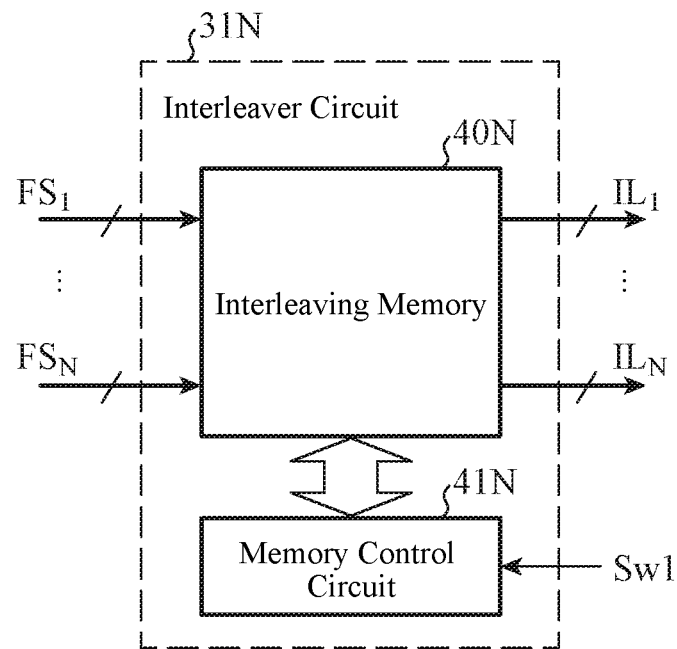
FIG. 22 is a functional block diagram showing the schematic configuration of an interleaver circuit in the error correction encoder according to Embodiment 2.

The interleaver circuit 31N fundamentally has the same configuration as the interleaver circuit 31 according to above-mentioned Embodiment 1 with the exception that the interleaver circuit 31N can perform interleaving on N series of input sequences instead of two series of input sequences. FIG. 22 is a functional block diagram showing an example of the configuration of the interleaver circuit 31N. As shown in FIG. 22, this interleaver circuit 31N is comprised of an interleaving memory 40N including a buffer memory such as an SDRAM, and a memory control circuit 41N that controls a data writing operation and a data reading operation on this interleaving memory 40N.

The transmission apparatus according to this embodiment has operation modes including a standard speed mode in which the transmission apparatus transmits an information signal IS at a standard speed (for example, 100 Gigabit/sec), and an N-times speed mode in which the transmission apparatus transmits an information signal IS at a transmission speed that is N times the standard speed (for example, N×100 Gigabit/sec). The transmission controller according to this embodiment causes the transmission apparatus to operate in either the standard speed mode or the N-times speed mode in accordance with the set transmission speed (either the standard speed or N times the standard speed). When the transmission apparatus operates in the standard speed mode, the error correction encoder 10N receives a single series of information sequences from an information source and outputs a single series of code sequences. In contrast, when the transmission apparatus operates in the N-times speed mode, the error correction encoder 10N receives N series of information sequences from the information source and outputs N series of code sequences.

In FIG. 21, for the sake of expediency in explanation, a state in the N-times speed mode in which N series of information sequences $IS_1, \ldots,$ and $IS_N$ are input in parallel to the error correction encoder 10N is shown. In the standard speed mode, only information sequences $IS_1$ are input to the error correction encoder 10N, and no other information sequences are input. The interleaver circuit 31N in the standard speed mode performs a first interleaving operation in accordance with a switching control signal Sw1. More specifically, like the interleaver circuit 31 according to above-mentioned Embodiment 1, the interleaver circuit 31N selects plural columns that are arranged at an interval of C columns (where C is an integral multiple of N) in a single series of transmission frames, for each interleaving unit, and generates a single series of yet-to-be-coded bit sequences $IL_1$ by sequentially selecting bits at an interval of R rows (where R is a positive integer) from each of the selected plural columns.

On the other hand, the interleaver circuit 31N in the N-times speed mode performs a second interleaving operation in accordance with the switching control signal Sw1. More specifically, the interleaver circuit 31N selects plural columns that are arranged at an interval of the shortened length which is one N-th of C columns used in the standard speed mode, i.e., at an interval of C/N columns in each of N series of transmission frames, for each interleaving unit, and generates N series of yet-to-be-coded bit sequences $IL_1, \ldots,$ and $IL_N$ by sequentially selecting bits at an interval of R rows from each of the selected plural columns. The total number of yet-to-be-coded bit sequences generated in the standard speed mode is the same as the total number of yet-to-be-coded bit sequences generated in the N-times speed mode, like in the case of Embodiment 1.

Figure 23:
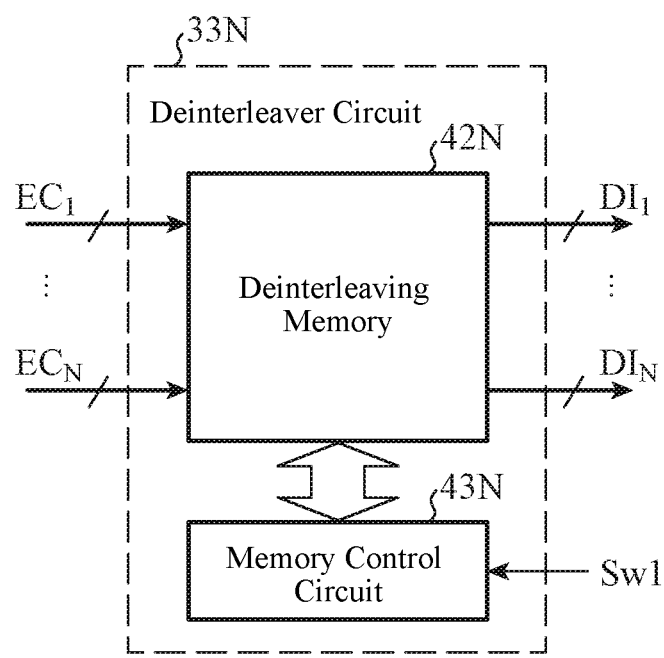
FIG. 23 is a functional block diagram showing the schematic configuration of a deinterleaver circuit in the error correction encoder according to Embodiment 2.

The deinterleaver circuit 33N fundamentally has the same configuration as the above-mentioned deinterleaver circuit 33 with the exception that the deinterleaver circuit 33N can perform interleaving on N series of input sequences instead of two series of input sequences. More specifically, the deinterleaver circuit 33N performs a first deinterleaving operation which is the inverse conversion corresponding to the first interleaving operation in the standard speed mode and performs a second deinterleaving operation which is the inverse conversion corresponding to the second interleaving operation in the N-times speed mode, in accordance with the switching control signal Sw1. FIG. 23 is a functional block diagram showing an example of the configuration of the deinterleaver circuit 33N. As shown in FIG. 23, this deinterleaver circuit 33N is comprised of an interleaving memory 42N including a buffer memory such as an SDRAM, and a memory control circuit 43N that controls a data writing operation and a data reading operation on this interleaving memory 42N.

Figure 24:
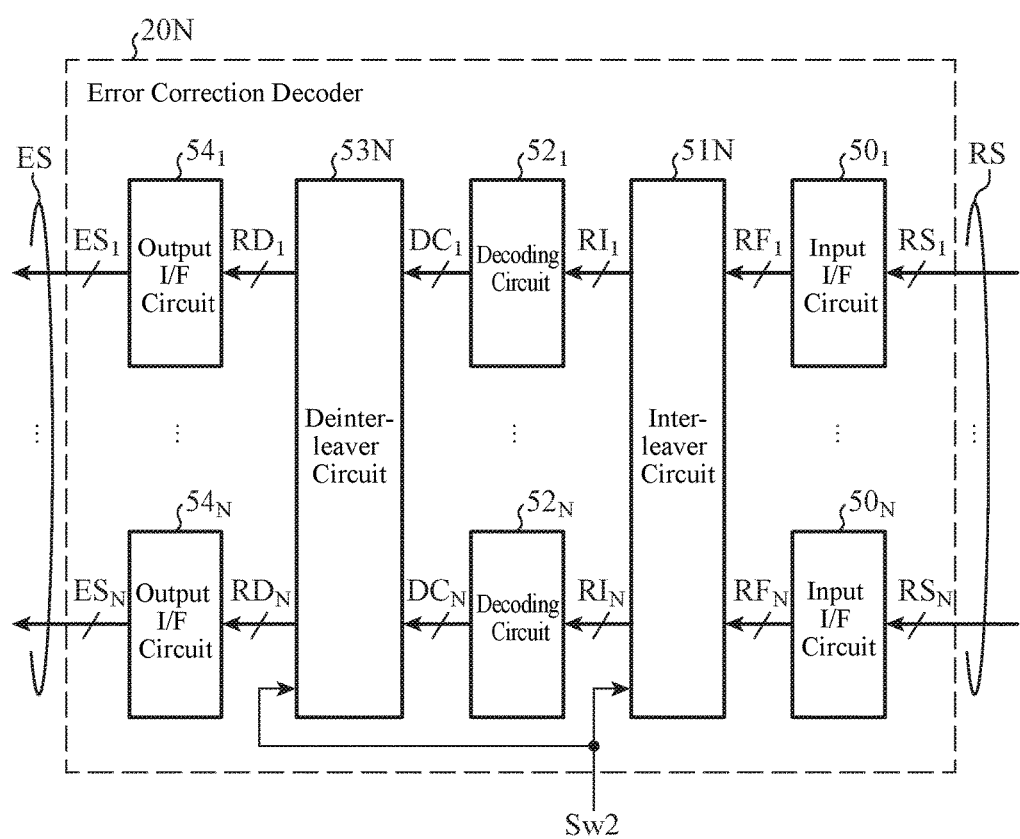
FIG. 24 is a functional block diagram showing the schematic configuration of an error correction decoder according to Embodiment 2.

FIG. 24 is a functional block diagram showing the schematic configuration of an error correction decoder 20N according to Embodiment 2 of the present invention. The configuration of a reception apparatus according to this embodiment is the same as that of the reception apparatus Rx according to Embodiment 1 with the exception that an error correction decoder 20N shown in FIG. 24 is disposed instead of the error correction decoder 20 shown in FIG. 1.

As shown in FIG. 24, the error correction decoder 20N includes input interface circuits (input I/F circuits) $50_1, \ldots,$ and $50_N$ having the same configuration, an interleaver circuit 51N, encoding circuits $52_1, \ldots,$ and $52_N$ having the same configuration, a deinterleaver circuit 53N, and output interface circuits (output I/F circuits) $54_1, \ldots,$ and $54_N$ having the same configuration.

Figure 25:
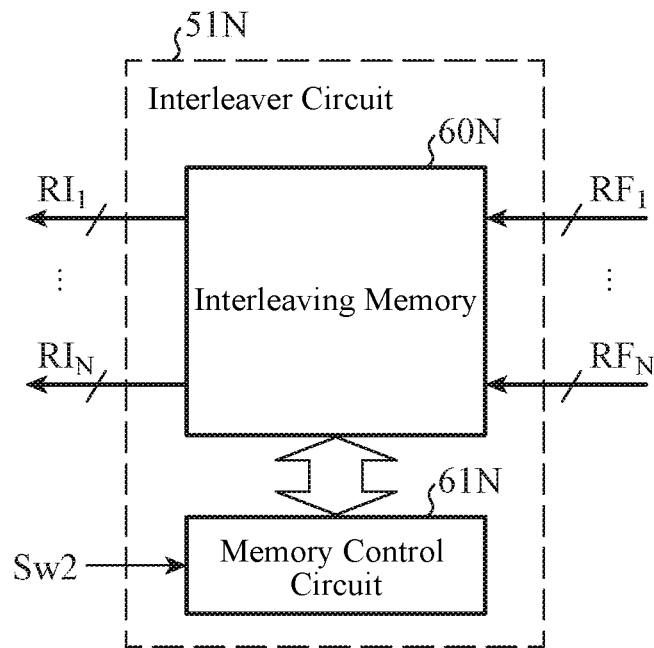
FIG. 25 is a functional block diagram showing the schematic configuration of an interleaver circuit in the error correction decoder according to Embodiment 2.

The interleaver circuit 51N fundamentally has the same configuration as the above-mentioned interleaver circuit 51 with the exception that the interleaver circuit 51N can perform interleaving on N series of input sequences. More specifically, the interleaver circuit 51N is configured so as to perform a first interleaving operation in the standard speed mode and perform a second interleaving operation in the N-times speed mode, in accordance with a switching control signal Sw2. FIG. 25 is a functional block diagram showing an example of the configuration of the interleaver circuit 51N. As shown in FIG. 25, this interleaver circuit 51N is comprised of an interleaving memory 60N including a buffer memory such as an SDRAM, and a memory control circuit 61N that controls a data writing operation and a data reading operation on this interleaving memory 60N.

Figure 26:
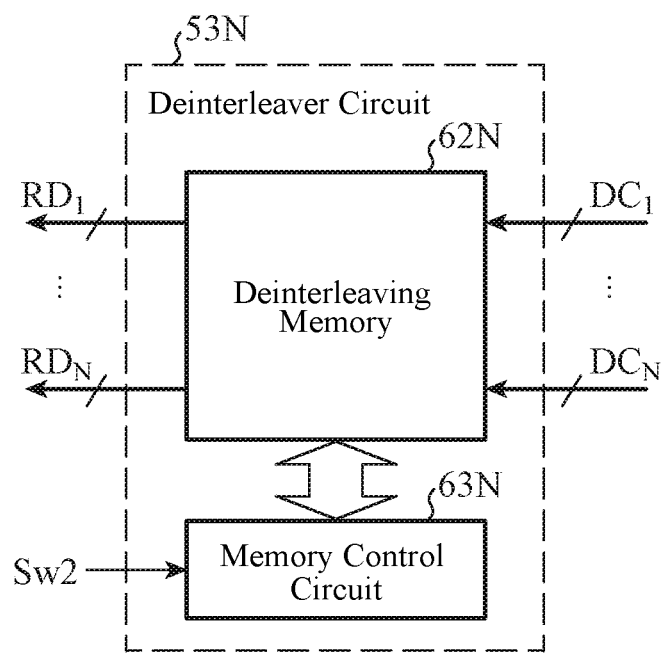
FIG. 26 is a functional block diagram showing the schematic configuration a deinterleaver circuit in the error correction decoder according Embodiment 2.

Further, the deinterleaver circuit 53N fundamentally has the same configuration as the above-mentioned deinterleaver circuit 53 with the exception that the deinterleaver circuit 53N can perform deinterleaving on N series of input sequences. More specifically, the deinterleaver circuit 53N is configured so as to perform the first deinterleaving operation in the standard speed mode and perform the second deinterleaving operation in the N-times speed mode, in accordance with the switching control signal Sw2. FIG. 26 is a functional block diagram showing an example of the configuration of the deinterleaver circuit 53N. As shown in FIG. 26, this deinterleaver circuit 53N is comprised of an interleaving memory 62N including a buffer memory such as an SDRAM, and a memory control circuit 63N that controls a data writing operation and a data reading operation on this interleaving memory 62N.

As described above, according to Embodiment 2, while data transmission can be performed on each series at a standard speed (=s Gigabit/sec) in the standard speed mode, data transmission can be performed on each series at a speed (=s×N Gigabit/sec) that is N times the standard speed, in the N-times speed mode. It is preferable that the interleaving memory 40N has a capacity corresponding to at least N frames, and interleaving of one or more frames is concurrently performed for each of the N series. Also in this case, the interleaver circuit 31N and the deinterleaver circuit 33N of the error correction encoder 10N can be used in common for both the standard speed mode and the N-times speed mode without providing N parallel-operating elements for every of the circuits in the error correction encoder 10N, like in the case of Embodiment 1. Therefore, the error correction encoder 10N and the transmission apparatus are enabled to change their execution speeds while avoiding an increase in their circuit scales. Also in the error correction decoder 20N corresponding to this error correction encoder 10N, the interleaver circuit 51N and the deinterleaver circuit 53N of the error correction decoder 20N can be used in common for both the standard speed mode and the N-times speed mode without providing N parallel-operating elements for every of the circuits in the error correction decoder. Therefore, the error correction decoder 20N and the reception apparatus are enabled to change their execution speeds while avoiding an increase in their circuit scales.

Embodiment 3

Figure 27:
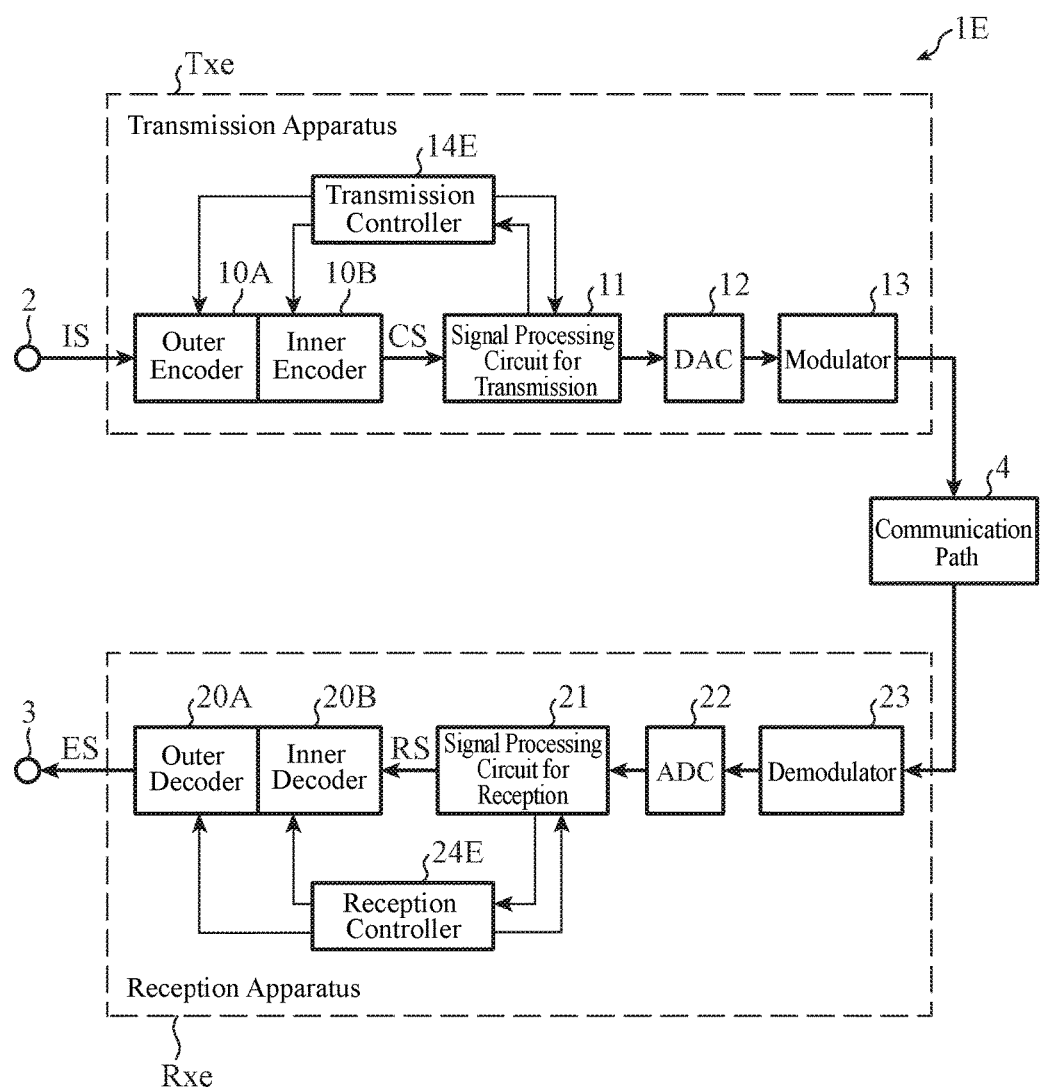
FIG. 27 is a functional block diagram showings the schematic configuration of a digital transmission system according to Embodiment 3 of the present invention.

FIG. 27 is a functional block diagram showing the schematic configuration of a digital transmission system 1E (simply referred to as a "transmission system 1E" from here on) according to Embodiment 3 of the present invention. This transmission system 1E includes a transmission apparatus Txe and a reception apparatus Rxe. The configuration of the transmission apparatus Txe is the same as that of the transmission apparatus Tx according to above-mentioned Embodiment 1 except for an outer encoder 10A and an inner encoder 10B. Further, the configuration of the reception apparatus Rxe is the same as that of the reception apparatus Rx according to above-mentioned Embodiment 1 except for an outer decoder 20A and an inner decoder 20B.

One or both of the outer and inner encoders 10A and 10B have the same configuration as that of the error correction encoder 10 according to above-mentioned Embodiment 1 or the error correction encoder 10N according to above-mentioned Embodiment 2. Further, one or both of the outer and inner decoders 20A and 20B have the same configuration as that of the error correction decoder 20 according to above-mentioned Embodiment 1 or the error correction decoder 20N according to above-mentioned Embodiment 2.

Figure 28:
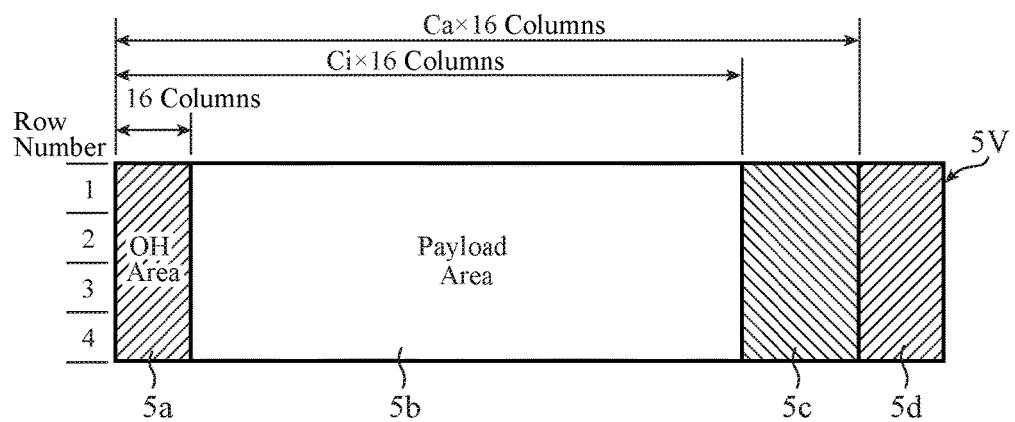
FIG. 28 is a diagram showing an example of the structure of an OTUkV frame.
Figure 29:
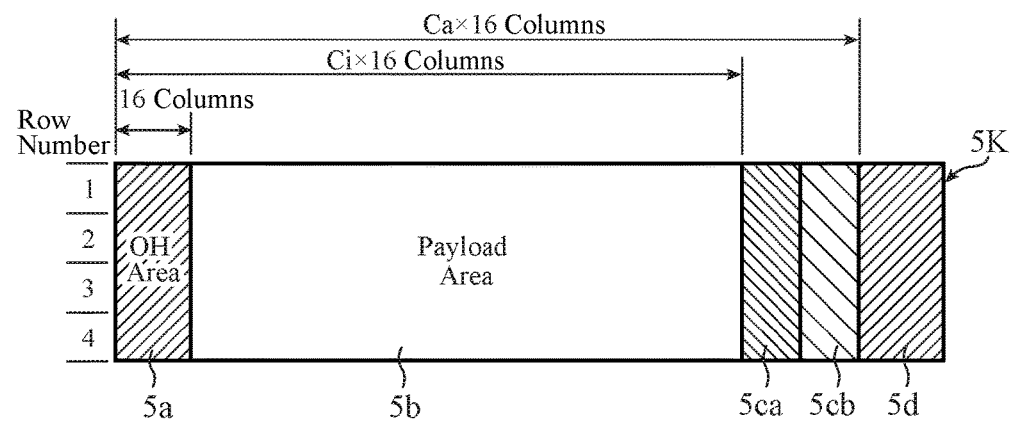
FIG. 29 is a diagram showing another example of the structure of an OTUkV frame.

Therefore, in this embodiment, error-correction coding can be configured so as to carry out concatenation of either two error correction codes or three or more error correction codes. FIG. 28 is a diagram showing the structure of an OUTkV frame 5V disclosed in ITU-T Recommendation G.709. Each OUTkV frame 5V has a parity sequence area 5c for outer codes, and a parity sequence area 5d for inner codes. FIG. 29 is a diagram showing the structure of another OUTkV frame 5K. Each OUTkV frame 5K has parity sequence areas 5ca and 5cb for outer codes, and a parity sequence area 5d for inner codes. In this embodiment, OUTkV frames 5V and 5K structured in this way can be formed and transmitted.

Although the various embodiments of the present invention are described with reference to the drawings, as described above, these embodiments exemplify the present invention, and various embodiments other than these embodiments can also be adopted. For example, although it is assumed in above-mentioned Embodiment 1 that the deinterleaver circuit 33 perfectly changes the order of input bit sequences to the original order before the first interleaving operation or the second interleaving operation, there is a case in which the order of input bit sequences does not necessarily have to be perfectly changed to the original order. For example, in a case in which the arrangement of a part of the bits of coded bit sequences $EC_1$ and $EC_2$ input to the deinterleaver circuit 33 is the same as that of a part of the bits of the code sequences $CS_1$ and $CS_2$ which construct the transmission frames, the configuration of the error correction encoder 10 can be modified so as not to perform deinterleaving on the part of the arrangement. Further, also in a case in which the frame structure of the bit sequences $FS_1$ and $FS_2$ before interleaving differs from the frame structure of the coded bit sequences $DI_1$ and $DI_2$ after deinterleaving, it is not necessary to perfectly change the order of input bit sequences to the deinterleaver circuit 33, to the original order.

The above-mentioned embodiments are not limited by the parameters shown as concrete examples, and it is needless to say that the error-correction coding method, the frame format length, the input and output parallel numbers, the transmission speed, and so on can be combined as appropriate as long as the combination is appropriately applied to any one of the above-mentioned embodiments.

It is to be understood that an arbitrary combination of two or more of above-mentioned Embodiments 1 to 3 can be made, various changes can be made in an arbitrary component according to anyone of the above-mentioned embodiments, and an arbitrary component according to any one of the above-mentioned embodiments can be omitted within the scope of the present invention.

INDUSTRIAL APPLICABILITY

The encoder device, the decoder device, the transmission apparatus and the reception apparatus according to the present invention can be used in a system that corrects errors occurring in the bits of digital data. For example, the encoder device, the decoder device, the transmission apparatus and the reception apparatus according to the present invention can be used in a digital communication system such as an optical transport system, an information storage system, and a computer system. Further, the encoder device, the decoder device, the transmission apparatus and the reception apparatus according to the present invention are not used limitedly in an optical transport system, but can be used in various types of transmission systems such as subscriber system cable communications, mobile wireless communications and satellite communications.

REFERENCE SIGNS LIST 1, 1E: digital transmission system; Tx, Txe: transmission apparatus; Rx, Rxe: reception apparatus; 2: information source; 3: receiver; 4: communication path; 5: OTUk frame; 10, 10N: error correction encoder; 11: signal processing circuit for transmission; 12: D/A converter (DAC); 13: modulator; 14: transmission controller; 20, 20N: error correction decoder; 21: signal processing circuit for reception; 22: A/D converter (ADC); 23: demodulator; 24: reception controller; $30_1$ to $30_N$: input interface circuit (input I/F circuit); 31, 31N: interleaver circuit; $32_1$ to $32_N$: encoding circuit; 33, 33N: deinterleaver circuit; 34₁ to 34_N: output interface circuit (output I/F circuit); 40, 40N interleaving memory; 41, 41N: memory control circuit; 42, 42N: deinterleaving memory; 43, 43N: memory control circuit; 50₁ to 50_N: input interface circuit (input I/F circuit); 51, 51N: interleaver circuit; 52₁ to 52_N: decoding circuit; 53, 53N: deinterleaver circuit; 54₁ to 54_N: output interface circuit (output I/F circuit); 60, 60N: interleaving memory; 61, 61N: memory control circuit; 62, 62N: deinterleaving memory; and 63, 63N: memory control circuit.

The invention claimed is:

1. An encoder device that operates in either a standard speed mode or a K-times speed mode where K is an integer larger than or equal to 2, and that applies error-correction coding to plural transmission frames, each transmission frame having a format of a bit array in row and column directions, the encoder device comprising:
   an interleaver circuit configured to, when a single series of plural transmission frames is input in the standard speed mode, perform a first interleaving operation to rearrange an order of bit sequences of the single series of transmission frames thereby to output a single series of yet-to-be-coded bit sequences, and configured to, when K series of transmission frames into which the single series of plural transmission frames is divided are inputted in the K-times speed mode, perform a second interleaving operation to change orders of bit sequences of the K series of transmission frames, thereby to output K series of yet-to-be-coded bit sequences in parallel;
   a group of encoding circuits configured to apply error-correction coding to either the single series of yet-to-be-coded bit sequences or the K series of yet-to-be-coded bit sequences; and
   a deinterleaver circuit configured to perform a deinterleaving operation on output sequences outputted from the group of encoding circuits,
   wherein the interleaver circuit generates, in the standard speed mode, the single series of yet-to-be-coded bit sequences on a basis of bits in plural columns that are arranged at an interval of C columns in the single series of transmission frames where C is an integral multiple of K, and generates, in the K-times speed mode, each of the K series of yet-to-be-coded bit sequences on a basis of bits in plural columns that are arranged at an interval of C/K columns in each of the K series of transmission frames.

2. The encoder device according to claim 1, wherein a total number of yet-to-be-coded bit sequences in the single series generated in the standard speed mode is equal to a total number of yet-to-be-coded bit sequences in the K series generated in the K-times speed mode.

3. The encoder device according to claim 1, wherein the interleaver circuit generates, in the standard speed mode, the single series of yet-to-be-coded bit sequences by sequentially selecting bits at an interval of R rows from each of the plural columns that are arranged at an interval of C columns where R is a positive integer, and generates, in the K-times speed mode, each of the K series of yet-to-be-coded bit sequences by sequentially selecting bits at an interval of R rows from each of the plural columns that are arranged at an interval of C/K columns.

4. The encoder device according to claim 1, wherein the interleaver circuit includes:
   an interleaving memory configured to temporarily store the transmission frames; and
   a memory controller for interleaving configured to control writing of the transmission frames into the interleaving memory,
   the memory controller for interleaving reading the single series of yet-to-be-coded bit sequences from the interleaving memory in the standard speed mode, and reading each of the K series of yet-to-be-coded bit sequences from the interleaving memory in the K-times speed mode.

5. The encoder device according to claim 1, further comprising a group of input interface circuits configured to output the single series of transmission frames to the interleaver circuit in the standard speed mode, and configured to output the K series of transmission frames in parallel to the interleaver circuit in the K-times speed mode.

6. The encoder device according to claim 1, wherein:
   the group of encoding circuits includes plural encoding circuits which apply, in parallel, error-correction coding to the K series of yet-to-be-coded bit sequences in the K-times speed mode, thereby to output K series of coded bit sequences in parallel;
   one of the plural encoding circuits applies error-correction coding to the single series of yet-to-be-coded bit sequences in the standard speed mode, thereby to output a single series of coded bit sequences; and
   the deinterleaver circuit performs a first deinterleaving operation corresponding to the first interleaving operation on the single series of coded bit sequences in the standard speed mode thereby to output a single series of bit sequences, and performs a second deinterleaving operation corresponding to the second interleaving operation on the K series of coded bit sequences in the K-times speed mode thereby to output K series of bit sequences in parallel.

7. The encoder device according to claim 6, wherein the deinterleaver circuit includes:
   a deinterleaving memory configured to temporarily store the single series of coded bit sequences in the standard speed mode and configured to temporarily store the K series of coded bit sequences in the K-times speed mode; and
   a memory controller for deinterleaving configured to control writing of the single series of coded bit sequences or the K series of coded bit sequences into the deinterleaving memory,
   the memory controller for deinterleaving configured to perform the first deinterleaving operation by selectively reading bits from the single series of coded bit sequences stored in the deinterleaving memory in the standard speed mode, and configured to perform the second deinterleaving operation by selectively reading bits from the K series of coded bit sequences stored in the deinterleaving memory in the K-times speed mode.

8. The encoder device according to claim 6, further comprising a group of output interface circuits configured to output the single series of bit sequences input thereto from the deinterleaver circuit in the standard speed mode, to an external device, and configured to output the K series of bit sequences input thereto from the deinterleaver circuit in the K-times speed mode, in parallel, to an external device.

9. The encoder device according to claim 1, wherein the transmission frames comply with ITU-T Recommendation G.709.

10. A decoder device that operates in either a standard speed mode or a K-times speed mode where K is an integer larger than or equal to 2, and that performs error-correction decoding on plural reception frames, each reception frame having a format of a received value arrangement in row and column directions, the decoder device comprising:

an interleaver circuit configured to, when a single series of plural reception frames is input in the standard speed mode, perform a first interleaving operation to rearrange an order of received value sequences of the single series of reception frames, thereby to output a single series of received value sequences, and configured to, when K series of reception frames into which the single series of plural reception frames is divided are input in the K-times speed mode, perform a second interleaving operation to rearrange an order of received value sequences of the K series of reception frames, thereby to output K series of received value sequences in parallel;

a group of decoding circuits configured to perform error-correction decoding on either the single series of received value sequences or the K series of received value sequences; and a deinterleaver circuit configured to perform a deinterleaving operation on output sequences outputted from the group of decoding circuits, wherein the interleaver circuit generates, in the standard speed mode, the single series of received value sequences on a basis of received values in plural columns that are arranged at an interval of C columns in the single series of reception frames where C is an integral multiple of K, and generates, in the K-times speed mode, each of the K series of received value sequences on a basis of received values in plural columns that are arranged at an interval of C/K columns in each of the K series of reception frames.

11. The decoder device according to claim 10, wherein a total number of received value sequences in the single series generated in the standard speed mode is equal to a total number of received value sequences in the K series generated in the K-times speed mode.

12. The decoder device according to claim 10, wherein the interleaver circuit generates, in the standard speed mode, the single series of received value sequences by sequentially selecting received values at an interval of R rows from each of the plural columns that are arranged at an interval of C columns where R is a positive integer, and generates, in the K-times speed mode, each of the K series of received value sequences by sequentially selecting received values at an interval of R rows from each of the plural columns that are arranged at an interval of C/K columns.

13. The decoder device according to claim 10, wherein the interleaver circuit includes:

an interleaving memory configured to temporarily store the reception frames; and a memory controller for interleaving configured to control writing of the reception frames into the interleaving memory, the memory controller for interleaving reading the single series of received value sequences from the interleaving memory in the standard speed mode, and reading each of the K series of received value sequences from the interleaving memory in the K-times speed mode.

14. The decoder device according to claim 10, further comprising a group of input interface circuits configured to output the single series of reception frames to the interleaver circuit in the standard speed mode, and configured to output, in parallel, the K series of reception frames to the interleaver circuit in the K-times speed mode.

15. The decoder device according to claim 10, wherein:

the group of decoding circuits includes plural decoding circuits which apply, in parallel, error-correction decoding on the K series of received value sequences in the K-times speed mode, thereby to output K series of decoded bit sequences in parallel;

one of the plural decoding circuits applies error-correction decoding to the single series of received value sequences in the standard speed mode, thereby to output a single series of decoded bit sequences; and the deinterleaver circuit performs a first deinterleaving operation corresponding to the first interleaving operation on the single series of decoded bit sequences in the standard speed mode thereby to output a single series of estimated bit sequences, and performs a second deinterleaving operation corresponding to the second interleaving operation on the K series of decoded bit sequences in the K-times speed mode thereby to output K series of estimated bit sequences in parallel.

16. The decoder device according to claim 15, wherein the deinterleaver circuit includes:

a deinterleaving memory configured to temporarily store the single series of decoded bit sequences in the standard speed mode and configured to temporarily store the K series of decoded bit sequences in the K-times speed mode; and a memory controller for deinterleaving configured to control writing of the single series of decoded bit sequences or the K series of decoded bit sequences into the deinterleaving memory, the memory controller for deinterleaving performing the first deinterleaving operation by selectively reading bits from the single series of decoded bit sequences stored in the deinterleaving memory in the standard speed mode, and performing the second deinterleaving operation by selectively reading bits from the K series of decoded bit sequences stored in the deinterleaving memory in the K-times speed mode.

17. The decoder device according to claim 15, further comprising a group of output interface circuits configured to output the single series of estimated bit sequences input thereto from the deinterleaver circuit in the standard speed mode, to an external device, and configured to output the K series of estimated bit sequences input thereto from the deinterleaver circuit in the K-times speed mode, in parallel, to an external device.

18. A transmission apparatus comprising:

the encoder device according to claim 1; and a transmitting circuit configured to convert output sequences outputted from the encoder device, into a modulated signal for transmission.

* * * * *